(12) United States Patent
Kotani

(10) Patent No.: US 8,587,030 B2
(45) Date of Patent: Nov. 19, 2013

(54) COMPOUND SEMICONDUCTOR DEVICE AND METHOD OF MANUFACTURING THE SAME

(75) Inventor: Junji Kotani, Isehara (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/550,805

(22) Filed: Jul. 17, 2012

(65) Prior Publication Data

US 2013/0075787 A1  Mar. 28, 2013

(30) Foreign Application Priority Data

Sep. 28, 2011  (JP) .................................. 2011-213115

(51) Int. Cl.
*H01L 29/66*  (2006.01)

(52) U.S. Cl.
USPC .......................................... 257/194; 438/172

(58) Field of Classification Search
USPC .......................................... 257/194; 438/172
See application file for complete search history.

(56) References Cited

U.S. PATENT DOCUMENTS

| 7,851,825 B2 * | 12/2010 | Suh et al. ....................... 257/194 |
| 7,859,021 B2 | 12/2010 | Kaneko |
| 7,985,987 B2 | 7/2011 | Kaneko |
| 8,076,698 B2 | 12/2011 | Ueda |
| 8,159,004 B2 * | 4/2012 | Sato .............................. 257/194 |
| 2009/0057720 A1 | 3/2009 | Kaneko |
| 2009/0121775 A1 | 5/2009 | Ueda |
| 2011/0062438 A1 | 3/2011 | Kaneko |

FOREIGN PATENT DOCUMENTS

| JP | 2007-19309 A1 | 1/2007 |
| JP | 2009-76845 A1 | 4/2009 |

* cited by examiner

*Primary Examiner* — David Vu
*Assistant Examiner* — Brandon Fox
(74) *Attorney, Agent, or Firm* — Kratz, Quintos & Hanson, LLP

(57) ABSTRACT

An embodiment of a compound semiconductor device includes: a substrate; a compound semiconductor stacked structure formed over the substrate; and a gate electrode, a source electrode and a drain electrode formed on or above the compound semiconductor stacked structure. The compound semiconductor stacked structure includes: an electron channel layer; and a nitride semiconductor layer which includes an electron supply layer formed over the electron channel layer. An indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

20 Claims, 25 Drawing Sheets

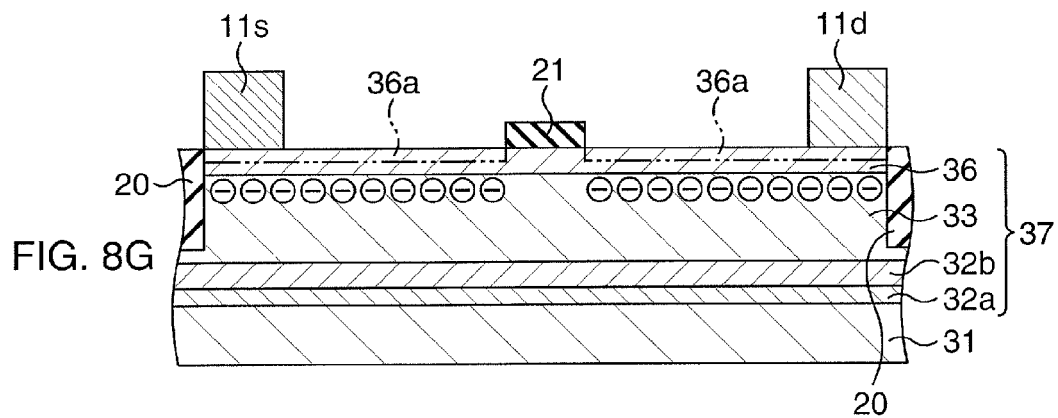
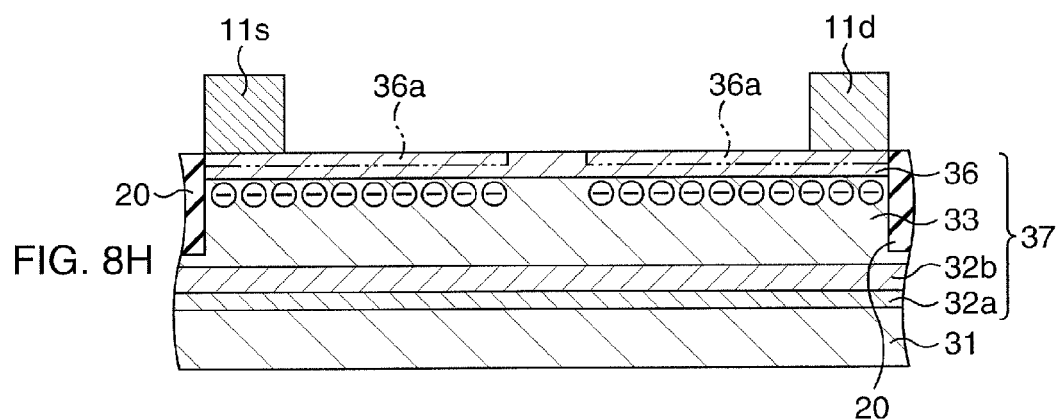
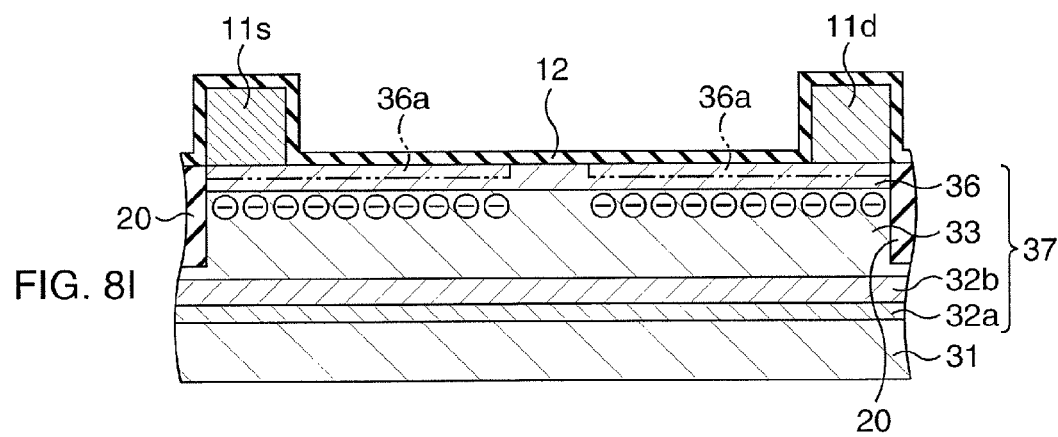

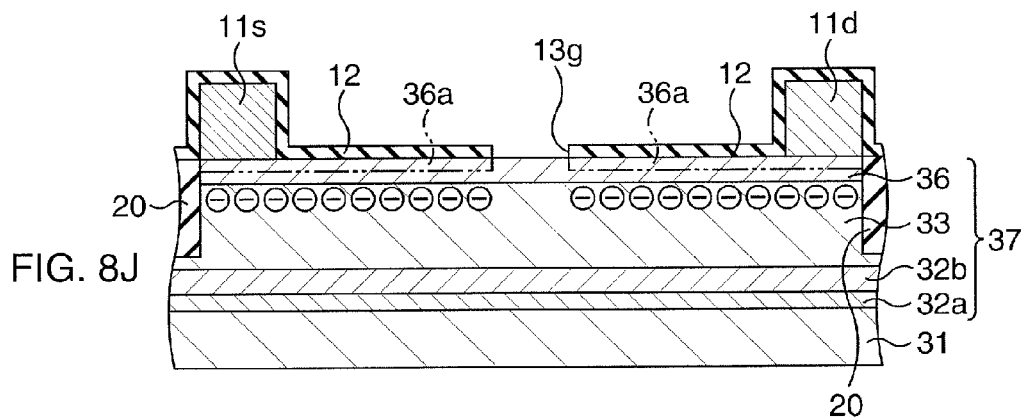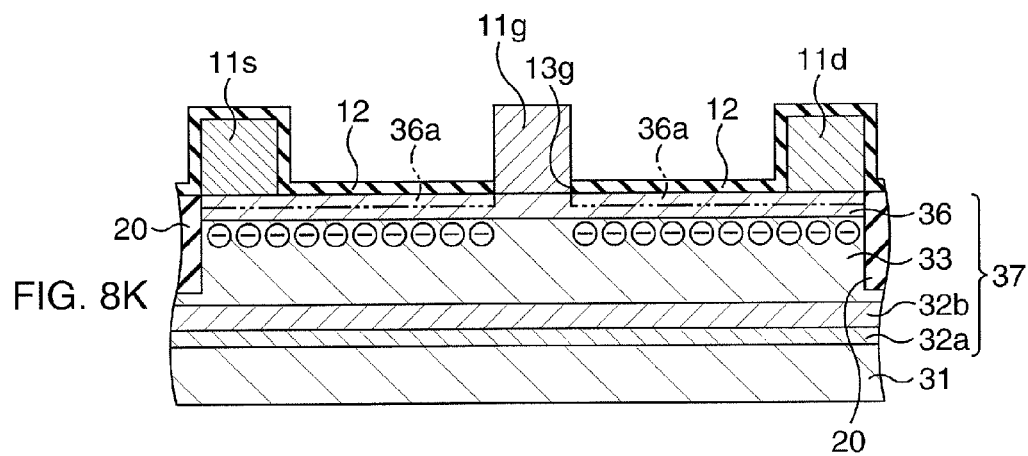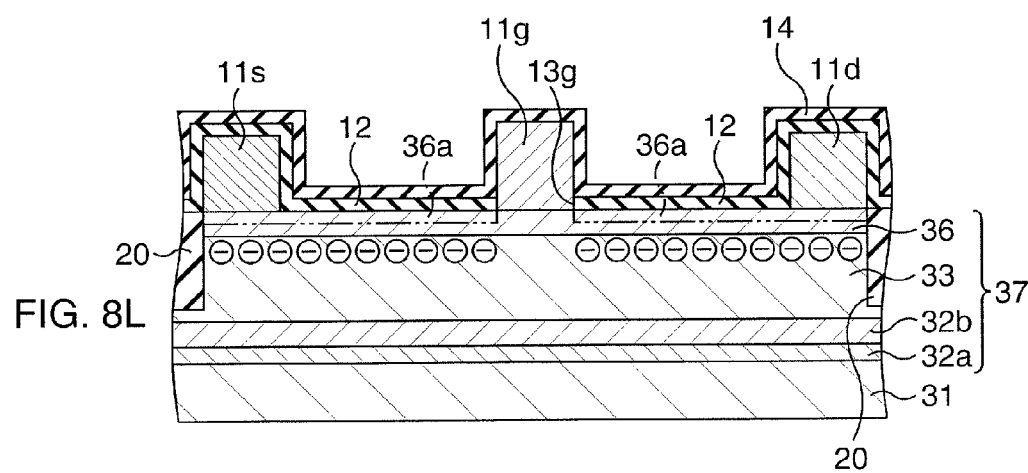

COMPOUND SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2011-213115, filed on Sep. 28, 2011, the entire contents of which are incorporated herein by reference.

FIELD

The embodiments discussed herein are related to a compound semiconductor device and a method of manufacturing the same.

BACKGROUND

Nitride semiconductors are characterized by their high saturation electron velocity and wide band gap. Thus, the nitride semiconductors have extensively been investigated, aiming at applying them to high-breakdown-voltage, high-output semiconductor devices making use of these characteristics. For example, GaN, which is nitride semiconductor, has a band gap of 3.4 eV, which is larger than the band gap of Si (1.1 eV) and the band gap of GaAs (1.4 eV). Accordingly, GaN has a large breakdown field strength. GaN is therefore very promising as a material for composing compound semiconductor devices for power supply apparatus, operable under high voltage and capable of yielding large output.

Numerous reports have been made on the semiconductor devices making use of the nitride semiconductor, typified by field effect transistors, and especially by high electron mobility transistor (HEMT). Among a GaN-based HEMT, an AlGaN/GaN-based HEMT using GaN for an electron channel layer and using AlGaN for an electron supply layer attracts a lot of attention. In the AlGaN/GaN-based HEMT, lattice distortion occurs in the AlGaN layer due to difference in lattice constants between GaN and AlGaN. The distortion induces piezo polarization and spontaneous polarization of AlGaN, and thereby generates a high-density, two-dimensional electron gas (2DEG). The AlGaN/GaN-based HEMT is therefore expected as high-efficiency switching devices, and high-breakdown-voltage power devices for electric vehicles, and so forth.

However, it is difficult to obtain normally-off transistors due to high density of the two-dimensional electron gas. Investigations into various techniques have therefore been directed to solve the problem. Conventional proposals include a technique of vanishing the two-dimensional electron gas by forming an InAlN layer between the gate electrode and the electron supply layer.

The InAlN layer, however, if formed so as to extend in a region, in planar view, between the gate electrode and the source electrode, and in a region between the gate electrode and the drain electrode, may vanish the 2DEG also in these regions (access areas), and may thereby elevate the on-resistance. Conventional investigations have been directed to remove the InAlN layer in the access areas by dry etching. The dry etching of the InAlN layer in the access areas, however, induces current collapse, and thereby makes it difficult to obtain a sufficient level of drain current.

[Patent Literature 1] Japanese Laid-Open Patent Publication No. 2009-76845

[Patent Literature 2] Japanese Laid-Open Patent Publication No. 2007-19309

SUMMARY

According to an aspect of the embodiments, a compound semiconductor device includes: a substrate; a compound semiconductor stacked structure formed over the substrate; and a gate electrode, a source electrode and a drain electrode formed on or above the compound semiconductor stacked structure. The compound semiconductor stacked structure includes: an electron channel layer; and a nitride semiconductor layer which includes an electron supply layer formed over the electron channel layer. An indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

According to another aspect of the embodiments, a method of manufacturing a compound semiconductor device includes: forming a compound semiconductor stacked structure over a substrate; and forming a gate electrode, a source electrode and a drain electrode on or above the compound semiconductor stacked structure. The forming the compound semiconductor stacked structure further comprises: forming an electron channel layer; and forming a nitride semiconductor layer which includes an electron supply layer over the electron channel layer. An indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

The object and advantages of the invention will be realized and attained by means of the elements and combinations particularly pointed out in the claims. It is to be understood that both the foregoing general description and the following detailed description are exemplary and explanatory and are not restrictive of the invention.

BRIEF DESCRIPTION OF DRAWINGS

FIGS. 8A to 8L are cross sectional views illustrating, in sequence, a method of manufacturing the compound semiconductor device according to the fifth embodiment;

DESCRIPTION OF EMBODIMENTS

Embodiments will be detailed below, referring to the attached drawings.

First Embodiment

Figure 1A:
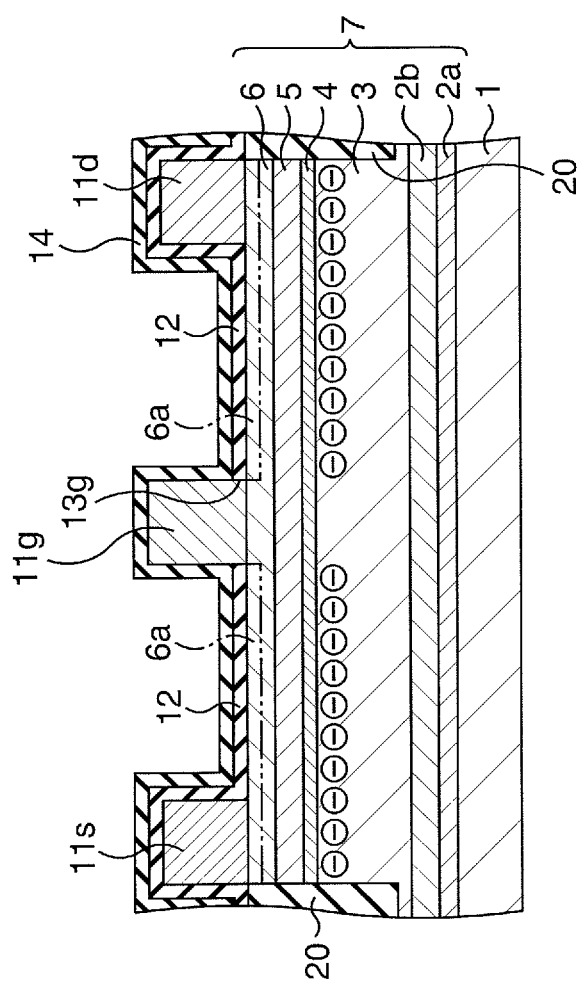
FIG. 1A is a cross sectional view illustrating a structure of a compound semiconductor device according to a first embodiment.

A first embodiment will be described. FIG. 1A is a cross sectional view illustrating a structure of a GaN-based HEMT (compound semiconductor device) according to the first embodiment.

In the first embodiment, as illustrated in FIG. 1A, a compound semiconductor stacked structure 7 is formed over a substrate 1 such as a Si substrate. The compound semiconductor stacked structure 7 includes an initial layer 2a, a buffer layer 2b, an electron channel layer 3, a spacer layer 4, an electron supply layer 5 and an In-containing layer 6. The initial layer 2a may be an AlN layer of approximately 160 nm thick, for example. The buffer layer 2b may be a stack of a plurality of $Al_xGa_{1-x}N$ layers ($0.2<x<0.8$) having an Al fraction gradually decreases from the initial layer 2a side towards the electron channel layer 3 side, for example. The buffer layer 2b may be 500 nm thick or around, for example. The electron channel layer 3 may be an i-GaN layer of approximately 1 μm thick, which is not intentionally doped with an impurity, for example. The spacer layer 4 may be an i-$Al_{0.2}Ga_{0.8}N$ layer of approximately 5 nm, which is not intentionally doped with an impurity, for example. The electron supply layer 5 may be an n-type $Al_{0.2}Ga_{0.8}N$ layer of approximately 20 nm thick, for example. The electron supply layer 5 may be doped with approximately $5\times10^{16}/cm^3$ of Si as an n-type impurity, for example. The In-containing layer 6 may be an InAlN layer of approximately 10 nm thick, for example. The spacer layer 4, the electron supply layer 5 and the In-containing layer 6 are an example of the nitride semiconductor layer.

An element isolation region 20 which defines an element region is formed in the compound semiconductor stacked structure 7. In the element region, a source electrode 11s and a drain electrode lid are formed on the In-containing layer 6. An insulating film 12 is formed so as to cover the source electrode 11s and the drain electrode lid over the In-containing layer 6. An opening 13g is formed in the insulating film 12 at a position in planar view between the source electrode 11s and the drain electrode 11d, and a gate electrode 11g is formed in the opening 13g. An insulating film 14 is formed so as to cover the gate electrode 11g over the insulating film 12. While materials for the insulating films 12 and 14 are not specifically limited, a Si nitride film may be used, for example. The insulating films 12 and 14 are an example of the termination film.

Figure 1B:
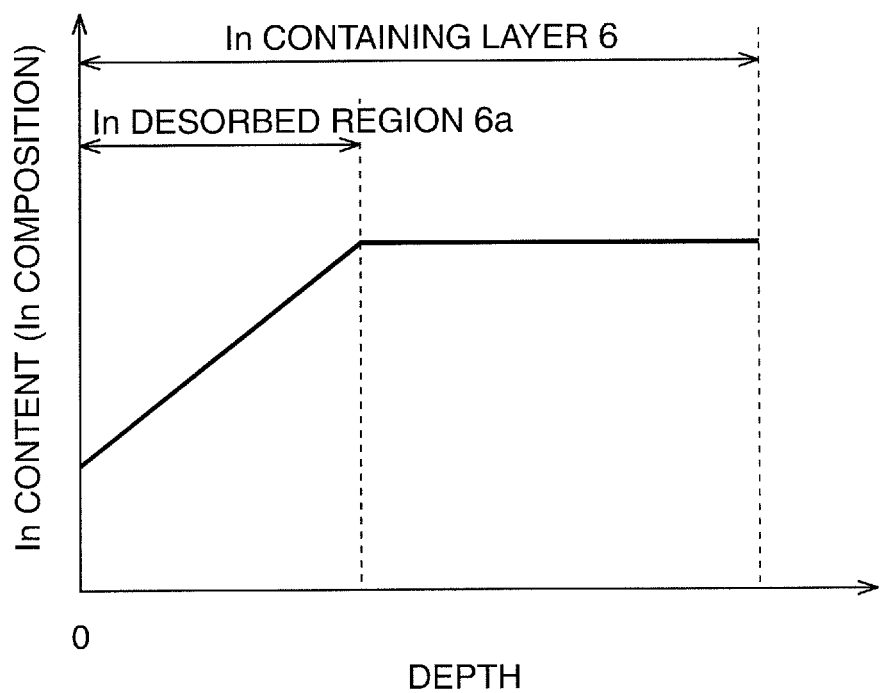
FIG. 1B is a drawing illustrating distribution of indium (In) fraction in an In-containing layer.

The In-containing layer 6 includes an In-eliminated region 6a. The In-eliminated region 6a is located in the surficial portion of the In-containing layer 6, excluding a region overlapped with the gate electrode 11g in planar view. An In fraction in the region of the In-containing layer 6 excluding the In-eliminated region 6a is substantially constant as described later, whereas the In fraction (In composition) in the In-eliminated region 6a decreases towards the surface (towards shallower portion of the In-eliminated region 6a), as illustrated in FIG. 1B.

Here, compositions of the In-containing layer 6 and the In-eliminated region 6a will be explained. In the embodiment, if there is no In-containing layer 6, 2DEG appears in the surficial portion of the electron channel layer 3, due to difference in lattice constants between GaN of the electron channel layer 3 and AlGaN of the electron supply layer 5. On the other hand, if there is the In-containing layer 6 on the electron supply layer 5, the 2DEG is vanished depending on the compositions. The embodiment adopts a composition capable of vanishing most of the 2DEG in the region below the gate electrode 11g (In fraction: 0.35 to 0.40, for example).

Accordingly, the 2DEG hardly exists below the gate electrode 11g, and this allows the normally-off operation in the embodiment. On the other hand, 2DEG having a sufficient level of concentration exists in a region located in planar view below the In-eliminated region 6a, or in an access area, since the In fraction of the In-eliminated region 6a is not high enough to vanish most of the 2DEG. The on-resistance may therefore be suppressed to a low level. In addition, the In-eliminated region 6a may be formed by annealing, for example, needing no dry etching as detailed later. The current collapse, which may otherwise be induced by damages in the process of dry etching, is avoidable.

Figure 2A:
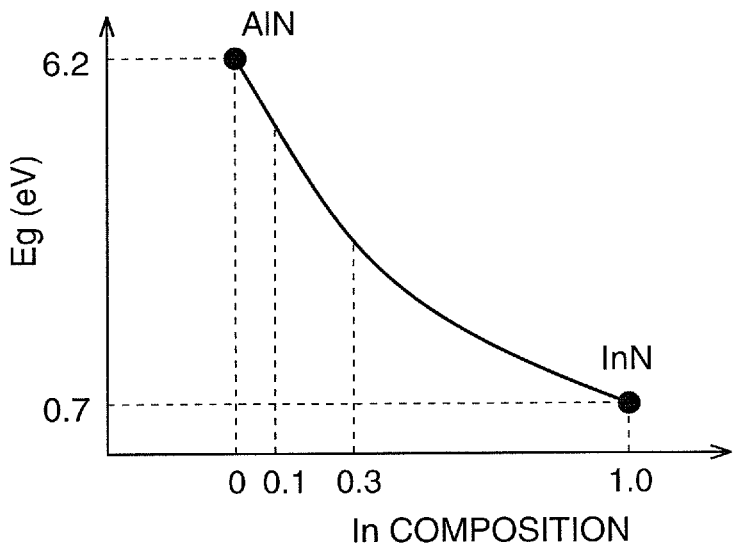
FIGS. 2A and 2B are drawings illustrating an example of function of the In-containing layer.
Figure 2B:
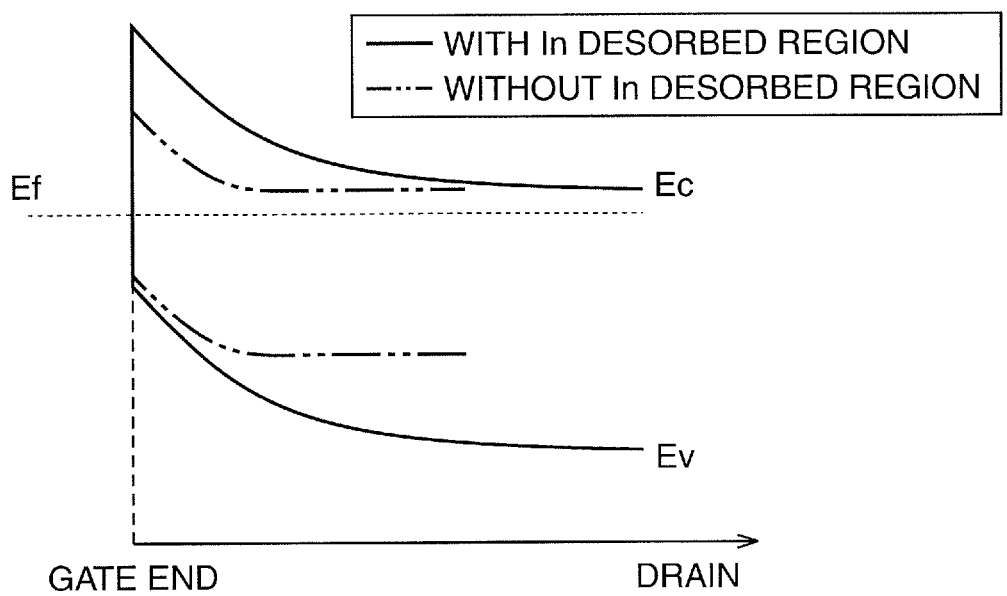

In addition, since the composition of the In-eliminated region 6a is more closer to AlN than the composition of the residual region of the In-containing layer 6 is, so that the In-eliminated region 6a has a large band gap as illustrated in FIG. 2A. Accordingly, as seen in FIG. 2B, a higher Schottky barrier to the gate electrode 11g is formed, as compared with the case having no In-eliminated region 6a, and thereby lateral injection of electron (leakage current) into the surficial portion may be suppressed. While the electron injection into the surficial portion may change the state of charging of the traps, and may destabilize the operation typified by current collapse, the embodiment can suppress the nonconformities.

As described in the above, excellent characteristics may be obtained by the embodiment.

Next, a method of manufacturing the GaN-based HEMT (compound semiconductor device) according to the first embodiment will be explained. FIG. 3A to FIG. 3L are cross sectional views illustrating, in sequence, the method of manufacturing the GaN-based HEMT (compound semiconductor device) according to the first embodiment.

Figure 3A:
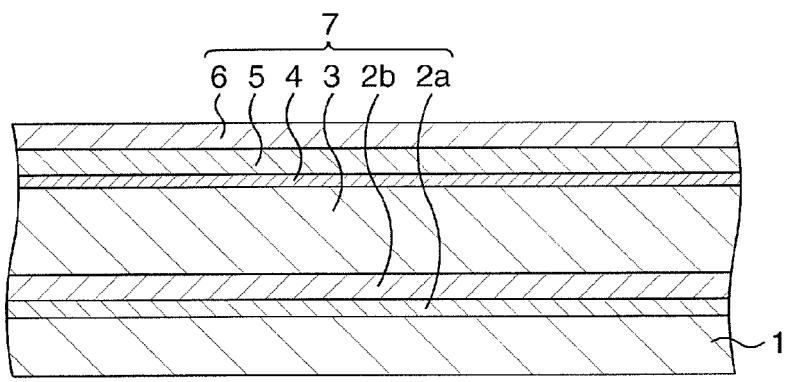
FIGS. 3A to 3L are cross sectional views illustrating, in sequence, a method of manufacturing the compound semiconductor device according to the first embodiment.

First, as illustrated in FIG. 3A, the compound semiconductor stacked structure 7 is formed over the substrate 1. In the process of forming the compound semiconductor stacked structure 7, the initial layer 2a, the buffer layer 2b, the electron channel layer 3, the spacer layer 4, the electron supply layer 5 and the In-containing layer 6 may be formed by a crystal growth process such as metal organic vapor phase epitaxy (MOVPE) and molecular beam epitaxy (MBE). In the process of forming the AlN layer, the AlGaN layer and the GaN layer by MOVPE, a mixed gas of trimethylaluminum (TMA) gas as an Al source, trimethylgallium (TMG) gas as a Ga source, and ammonia ($NH_3$) gas as a N source, may be used. In the process, on/off of supply and flow rates of trimethylaluminum gas and trimethylgallium gas are appropriately set, depending on compositions of the compound semiconductor layers to be grown. Flow rate of ammonia gas, which is common to all compound semiconductor layers, may be set to approximately 100 ccm to 10 LM. Growth pressure may be adjusted to approximately 50 Torr to 300 Torr, and growth temperature may be adjusted to approximately 1000° C. to 1200° C., for example. In the process of growing the n-type compound semiconductor layers, Si may be doped into the compound semiconductor layers by adding $SiH_4$ gas, which contains Si, to the mixed gas at a predetermined flow rate, for example. Dose of Si is adjusted to approximately $1\times10^{16}/cm^3$ to $1\times10^{20}/cm^3$, and to $5\times10^{18}/cm^3$ or around, for example. In the process of forming the InAlN layer, a mixed gas of trimethylaluminum (TMA) gas as an Al source, trimethylindium (TMI) gas as an In source, and ammonia ($NH_3$) gas as a N source, may be used. In the process, growth pressure may be adjusted to approximately 50 Torr to 200 Torr, and growth temperature may be adjusted to approximately 650° C. to 800° C., for example.

Figure 3B:
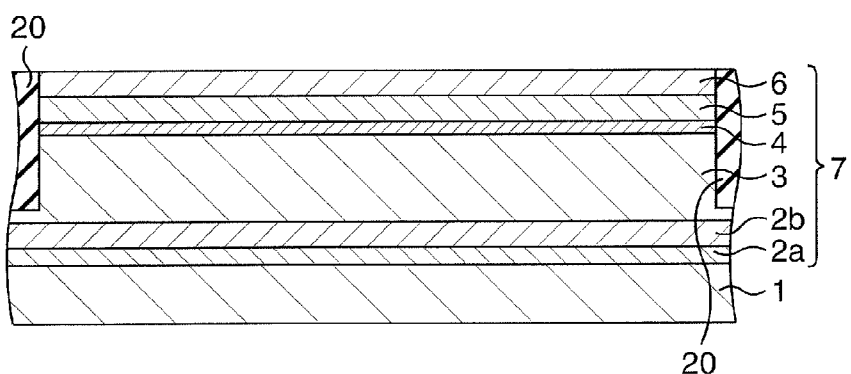

Next, as illustrated in FIG. 3B, the element isolation region 20 which defines the element region is formed in the compound semiconductor stacked structure 7. In the process of forming the element isolation region 20, for example, a photoresist pattern is formed over the compound semiconductor stacked structure 7 so as to selectively expose region where the element isolation region 20 is to be formed, and ion such as Ar ion is implanted through the photoresist pattern used as a mask. Alternatively, the compound semiconductor stacked structure 7 may be etched by dry etching using a chlorine-containing gas, through the photoresist pattern used as an etching mask.

Figure 3C:
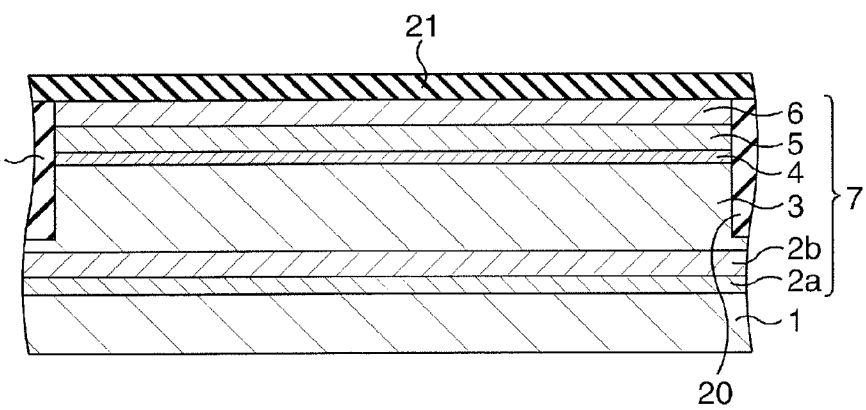

Thereafter, as illustrated in FIG. 3C, a silicon nitride film 21 is formed over the entire surface. The silicon nitride film 21 is formed by a plasma-assisted chemical vapor deposition (CVD) process, for example, and is approximately 100 nm thick. Alternatively, the silicon nitride film 21 may be formed before the element isolation region 20 is formed, as continued from the formation of the In-containing layer 6. In this case, $SiH_4$ gas may be used as a source gas, for example, and the silicon nitride film 21 grown is approximately 10 nm thick.

Figure 3D:
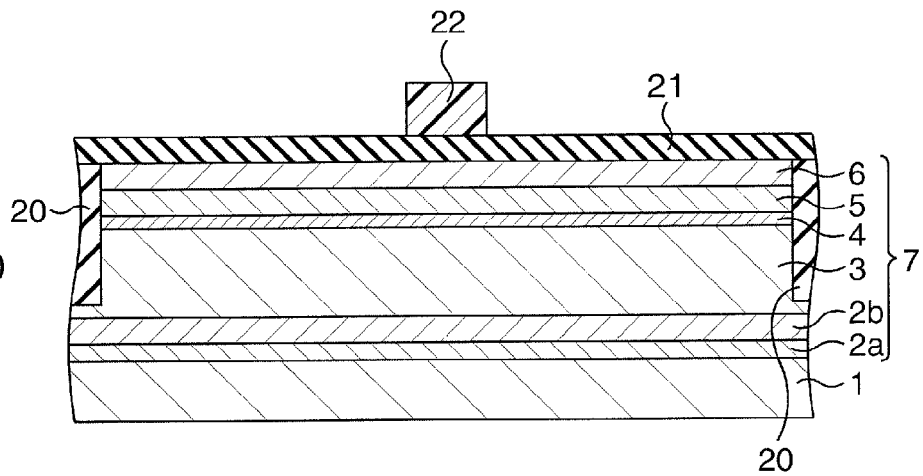

Next, as illustrated in FIG. 3D, a photoresist is coated and then patterned, to thereby form a resist pattern 22 so as to cover a region in which the gate electrode is to be formed, and so as to expose the residual region.

Figure 3E:
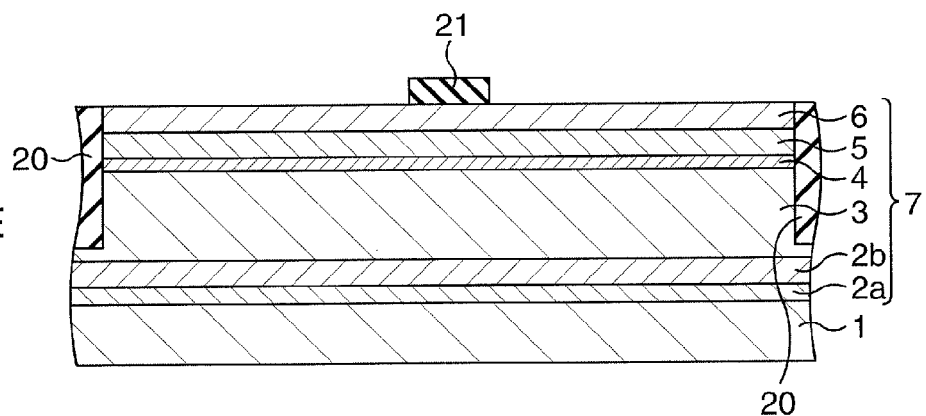

Next, as illustrated in FIG. 3E, the silicon nitride film 21 is etched by wet etching using the resist pattern 22 as an etching mask, and using a HF-based solution. As a result, the surface of the In-containing layer 6 exposes in the access areas of the GaN-based HEMT. The resist pattern 22 is then removed.

Figure 3F:
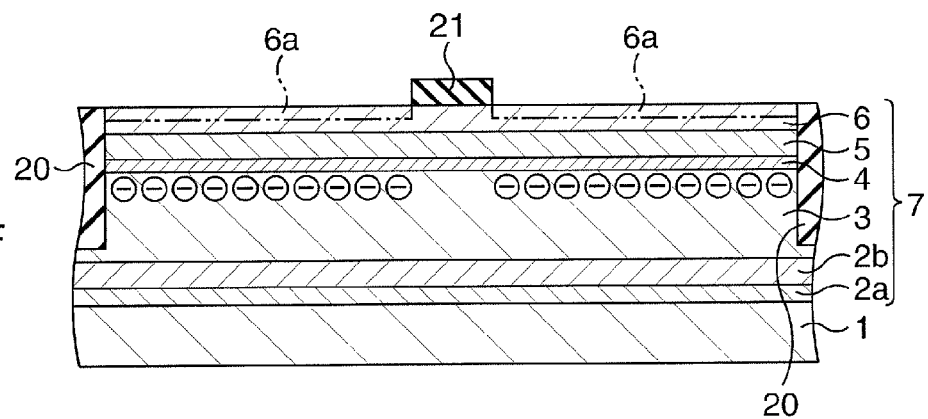

Thereafter, annealing is conducted in a non-oxidative atmosphere to thereby allow indium (In) to be eliminated from the surficial portion of the In-containing layer 6. Accordingly, as illustrated in FIG. 3F, the In-eliminated region 6a lowered in the In fraction is formed in the surficial portion of the In-containing layer 6 (see FIG. 1B). Gases adoptable to configure the non-oxidative atmosphere include $N_2$ gas, $H_2$ gas, or a mixed gas of $N_2$ gas and $H_2$ gas, without special limitation. Temperature of the annealing is preferably adjusted to 700° C. to 800° C. or around, and to 750° C. or around, for example, although not specifically limited. As the In-eliminated region 6a is formed, a high-concentration 2DEG emerges in the surficial portion of the electron channel layer 3 below the In-eliminated region 6a.

Figure 3G:
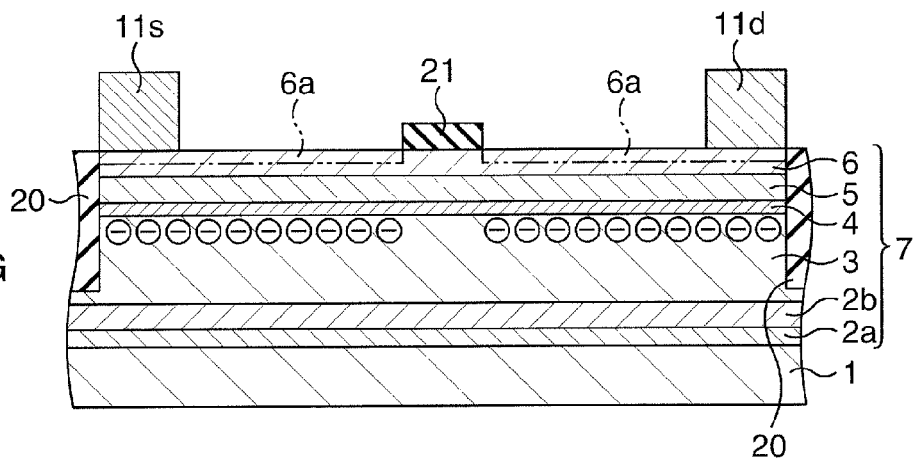

Next, as illustrated in FIG. 3G, the source electrode 11s and the drain electrode 11d are formed on the In-containing layer 6. The source electrode 11s and the drain electrode 11d may be formed by a lift-off process, for example. More specifically, a photoresist pattern is formed so as to expose regions where the source electrode 11s and the drain electrode 11d are to be formed, a metal film is formed over the entire surface by an evaporation process while using the photoresist pattern as a growth mask, and the photoresist pattern is then removed together with the portion of the metal film deposited thereon. In the process of forming the metal film, for example, a Ti film of approximately 100 nm thick may be formed, and an Al film of approximately 300 nm thick may be then formed. The metal film is then annealed (by rapid thermal annealing (RTA), for example) in a $N_2$ gas atmosphere at 400° C. to 1000° C. (at 600° C., for example) so as to establish the ohmic characteristic.

Figure 3H:
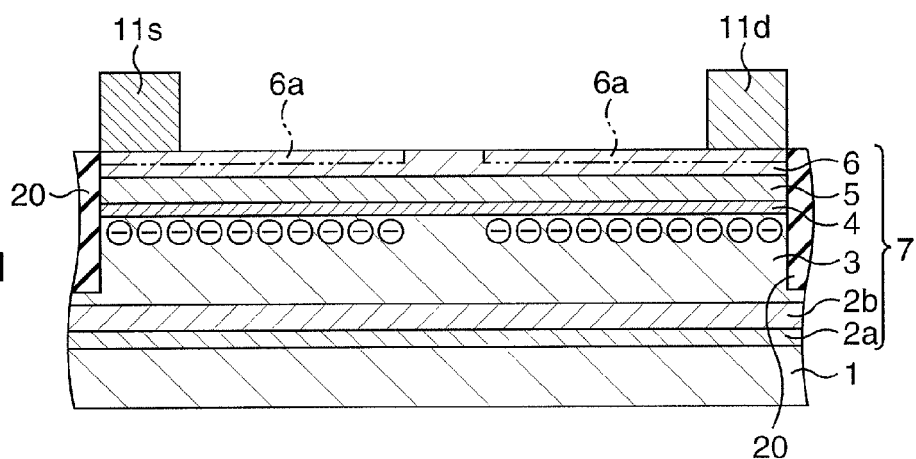
Figure 3I:
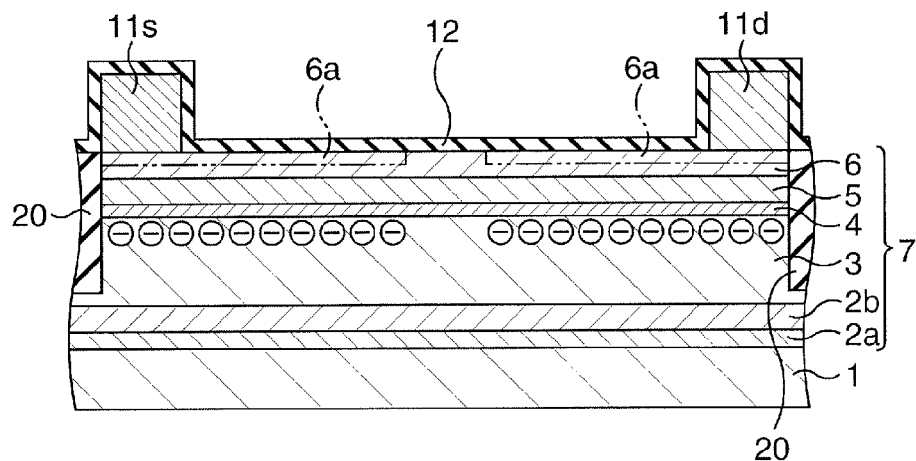

Thereafter, as illustrated in FIG. 3H, the silicon nitride film 21 is removed by wet etching. Next, as illustrated in FIG. 3I, the insulating film 12 is formed over the entire surface. The insulating film 12 is preferably formed, for example, by atomic layer deposition (ALD), plasma-assisted CVD or sputtering.

Figure 3J:
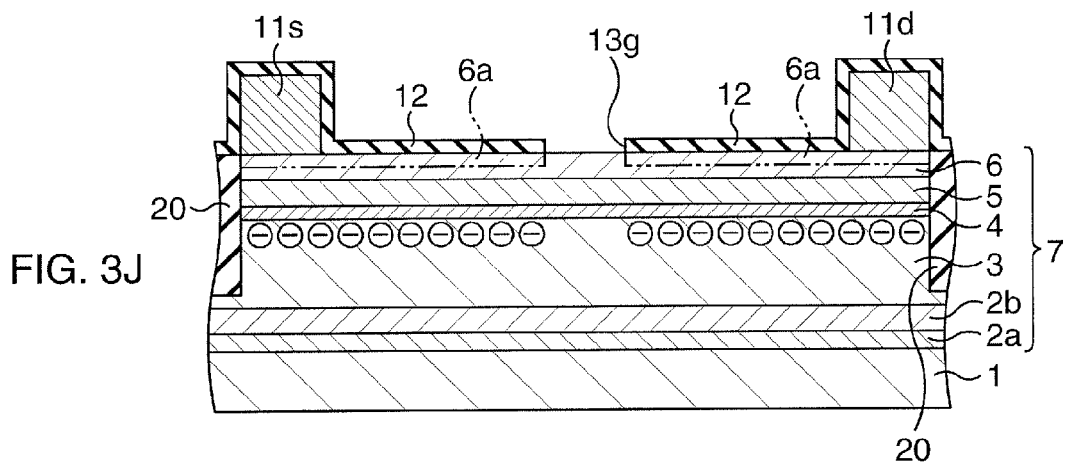

Next, as illustrated in FIG. 3J, the opening 13g is formed in the insulating film 12 at a position in planar view between the source electrode 11s and the drain electrode 11d. In this process, the portion of the In-containing layer 6 having no In-eliminated region 6a formed therein may be overlapped in planar view with the opening 13g, for example.

Figure 3K:
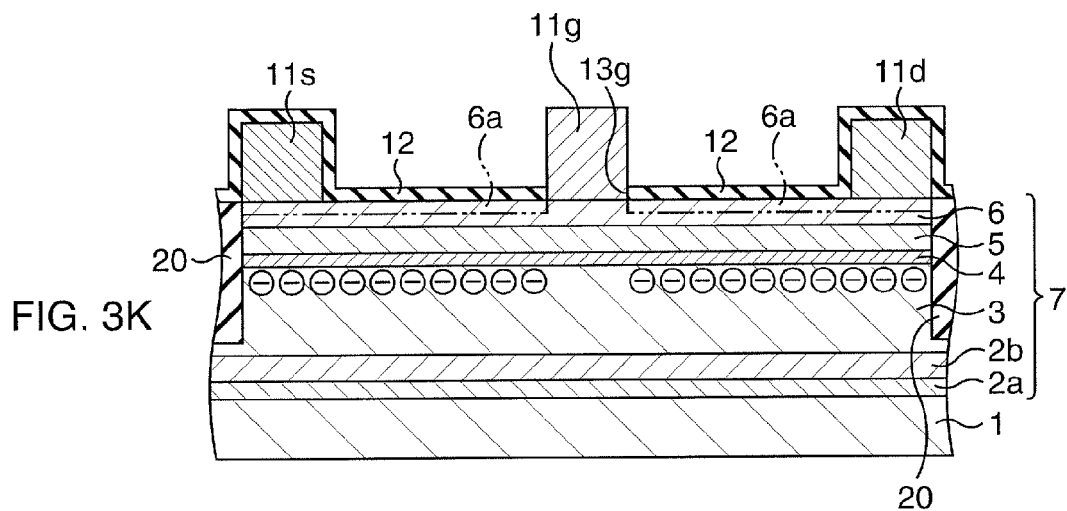
Figure 3L:
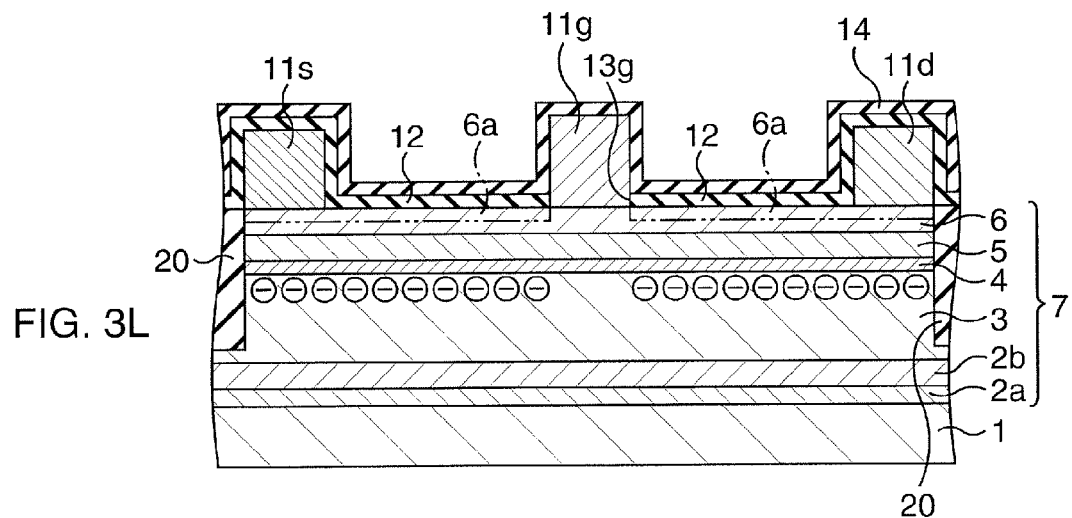

Next, as illustrated in FIG. 3K, the gate electrode 11g is formed in the opening 13g. The gate electrode 11g may be formed by a lift-off process, for example. More specifically, a photoresist pattern is formed so as to expose a region where the gate electrode 11g is to be formed, a metal film is formed over the entire surface by an evaporation process while using the photoresist pattern as a growth mask, for example, and the photoresist pattern is then removed together with the portion of the metal film deposited thereon. In the process of forming the metal film, for example, a Ni film of approximately 50 nm thick may be formed, and a Au film of approximately 300 nm thick may be then formed. Then, as illustrated in FIG. 3L, the insulating film 14 is formed so as to cover the gate electrode 11g over the insulating film 12.

The GaN-based HEMT according to the first embodiment may be thus manufactured.

Second Embodiment

Figure 4:
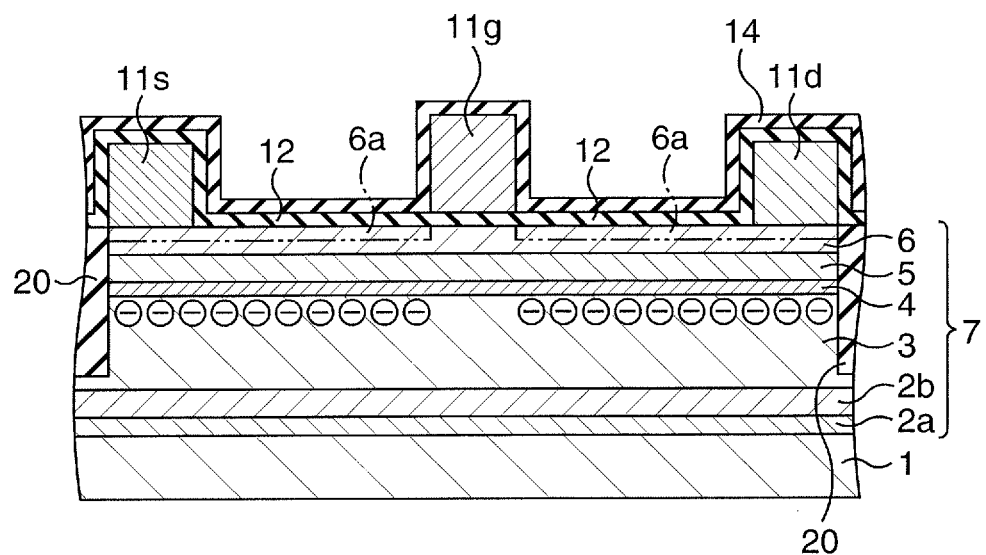
FIG. 4 is a cross sectional view illustrating a structure of a compound semiconductor device according to a second embodiment.

Next, a second embodiment will be explained. FIG. 4 is a cross sectional view illustrating a structure of a GaN-based HEMT (compound semiconductor device) according to the second embodiment.

In contrast to the first embodiment, having the gate electrode 11g brought into Schottky contact with the compound semiconductor stacked structure 7, the second embodiment adopts the insulating film 12 between the gate electrode 11g and the compound semiconductor stacked structure 7, so as to allow the insulating film 12 to function as a gate insulating film. In short, the opening 13g is not formed in the insulating film 12, and a MIS-type structure is adopted.

Also the second embodiment thus configured successfully achieves, similarly to the first embodiment, the effect of suppressing the current collapse, while achieving the normally-off operation, with the presence of the In-eliminated region 6a.

A material for the insulating film 12 is not specifically limited, wherein the preferable examples include oxide, nitride or oxynitride of Si, Al, Hf, Zr, Ti, Ta and W. Aluminum oxide is particularly preferable. Thickness of the insulating film 12 may be 2 nm to 200 nm, and 10 nm or around, for example.

Third Embodiment

Figure 5:
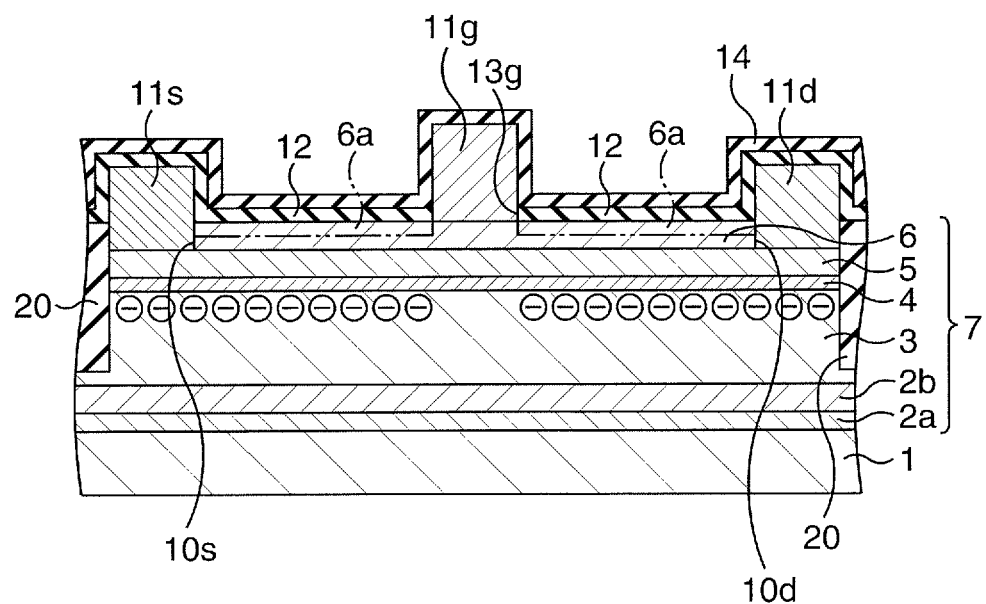
FIG. 5 is a cross sectional view illustrating a structure of a compound semiconductor device according to a third embodiment.

Next, a third embodiment will be explained. FIG. 5 is a cross sectional view illustrating a structure of a GaN-based HEMT (compound semiconductor device) according to the third embodiment.

In contrast to the first embodiment, having the source electrode 11s and the drain electrode 11d formed on the flat In-containing layer 6, recesses 10s and 10d are formed in the In-containing layer 6, and the source electrode 11s and the drain electrode 11d are respectively formed in the recesses 10s and 10d in the third embodiment.

Also the third embodiment thus configured successfully achieves, similarly to the first embodiment, the effect of suppressing the current collapse, while achieving the normally-off operation, with the presence of the In-eliminated region 6a.

The compound semiconductor device according to the third embodiment may be manufactured through the steps below. The recesses 10s and 10d are formed after the formation of the In-eliminated region 6a (FIG. 3F), and before the formation of the source electrode 11s and the drain electrode lid (FIG. 3G). Then the source electrode 11s and the drain electrode 11d are respectively formed in the recesses 10s and 10d. In the process of forming the recesses 10s and 10d, for example, a photoresist pattern is formed over the compound semiconductor stacked structure 7 so as to selectively expose regions where the recesses 10s and 10d are to be formed, and the In-containing layer 6 is etched by dry etching using a chlorine-containing gas, through the photoresist pattern used as an etching mask. Alternatively, a structure similar to the third embodiment may be obtained also by a method of a fourth embodiment described in the next.

Fourth Embodiment

Next, a fourth embodiment will be explained. FIG. 6A to FIG. 6E are cross sectional views illustrating, in sequence, a method of manufacturing a GaN-based HEMT (compound semiconductor device) according to the fourth embodiment.

Figure 6A:
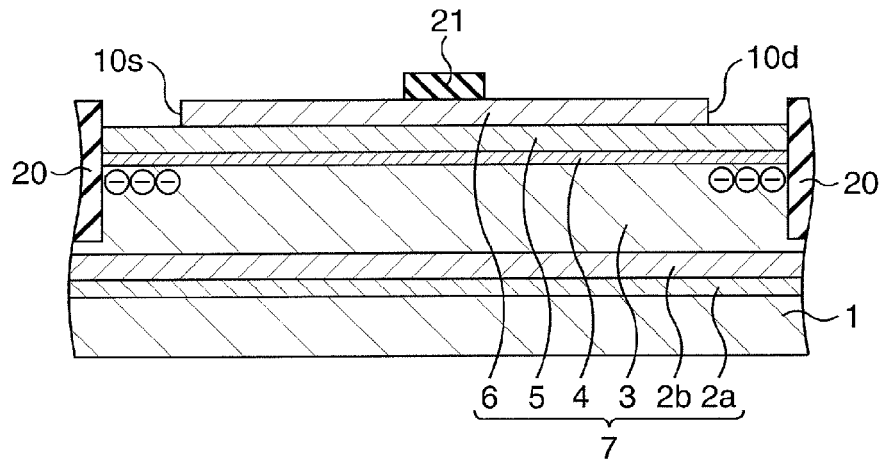
FIGS. 6A to 6E are cross sectional views illustrating, in sequence, a method of manufacturing a compound semiconductor device of a fourth embodiment.
Figure 6B:
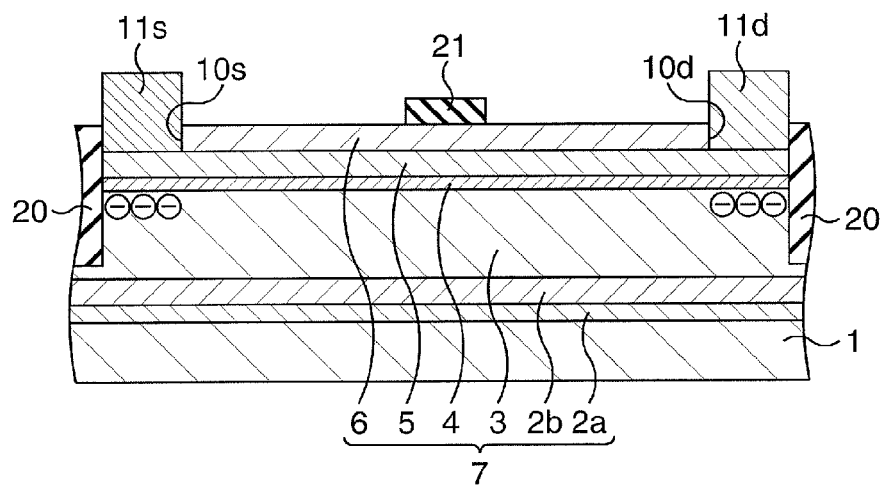

In the embodiment, first, the processes up to the wet etching (patterning) of the silicon nitride film 21 and the removal of the resist pattern 22 are conducted similarly to the first embodiment (FIG. 3E). Next, as illustrated in FIG. 6A, the recesses 10s and 10d are formed in the In-containing layer 6. Then, as illustrated in FIG. 6B, the source electrode 11s and the drain electrode 11d are formed respectively in the recesses 10s and 10d.

Figure 6C:
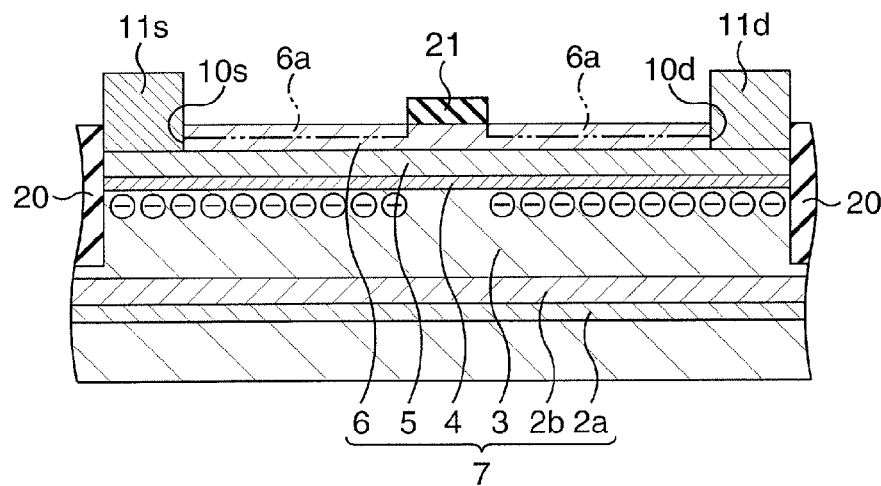

Next, for example, annealing (RTA, for example) is conducted in a $N_2$ gas atmosphere at 400° C. to 1000° C. (at 600° C., for example) to thereby establish the ohmic characteristic, and to allow indium (In) to be eliminated from the surficial portion of the In-containing layer 6. As a result, as illustrated in FIG. 6C, the In-eliminated region 6a having a lowered indium fraction is formed in the surficial portion of the In-containing layer 6. In short, in the embodiment, the annealing for establishing the ohmic characteristic is also effective to form the In-eliminated region 6a.

Figure 6D:
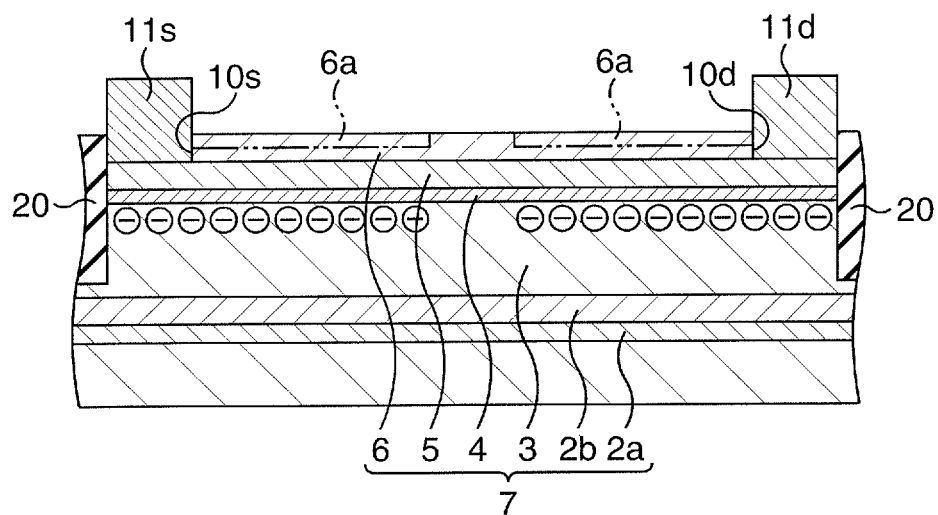
Figure 6E:
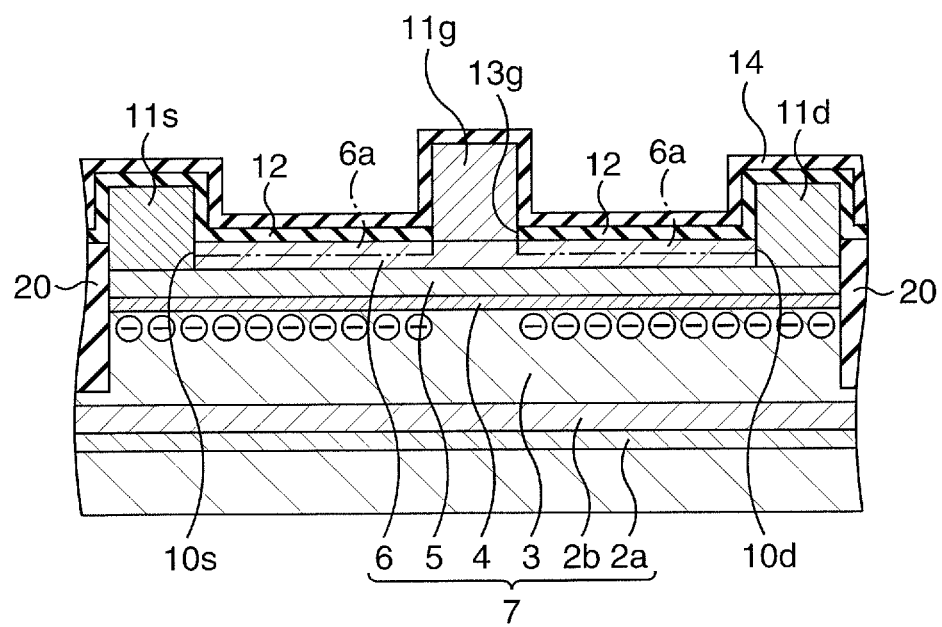

Next, as illustrated in FIG. 6D, the silicon nitride film 21 is removed by wet etching. Thereafter, the processes covering from the formation of the insulating film 12 up to the formation of the insulating film 14 are conducted similarly to the first embodiment, as illustrated in FIG. 6E.

According to the fourth embodiment, the number of times of annealing may be reduced from that in the first embodiment.

Fifth Embodiment

Figure 7:
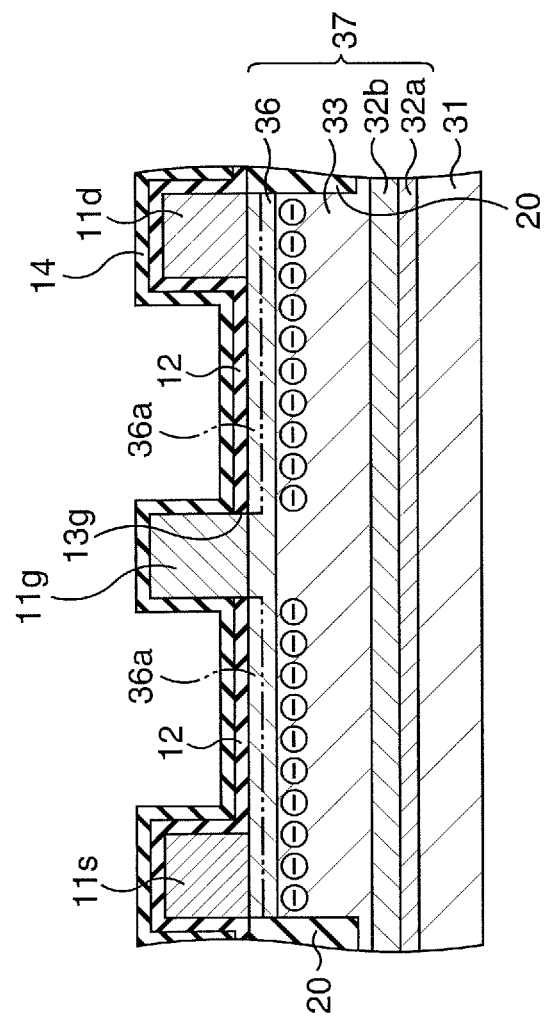
FIG. 7 is a cross sectional view illustrating a structure of a compound semiconductor device according to a fifth embodiment.

Next, a fifth embodiment will be explained. FIG. 7 is a cross sectional view illustrating a structure of a GaN-based HEMT (compound semiconductor device) according to the fifth embodiment.

In the fifth embodiment, as illustrated in FIG. 7, a compound semiconductor stacked structure 37 is formed over a substrate 31 such as Si substrate. The compound semiconductor stacked structure 37 includes an initial layer 32a, a buffer layer 32b, an electron channel layer 33, and an In-containing layer 36. The initial layer 32a may be an AlN layer of approximately 160 nm thick, for example. The buffer layer 32b may be a stack of a plurality of $Al_xGa_{1-x}N$ layers (0.2<x<0.8) having an Al fraction gradually decreases from the initial layer 32a side towards the electron channel layer 33 side, for example. The buffer layer 32b may be 500 nm thick or around, for example. The electron channel layer 33 may be an i-GaN layer or an i-AlGaN layer of approximately 1 μm thick, which is not intentionally doped with an impurity, for example. The In-containing layer 36 may be an InAlN layer of approximately 10 nm thick, for example. The In-containing layer 36 is an example of the nitride semiconductor layer.

An element isolation region 20 which defines an element region is formed in the compound semiconductor stacked structure 37. In the element region, the source electrode 11s and the drain electrode 11d are formed on the In-containing layer 36. The insulating film 12 is formed so as to cover the source electrode 11s and the drain electrode 11d over the In-containing layer 36. The opening 13g is formed in the insulating film 12 at a position in planar view between the source electrode 11s and the drain electrode 11d, and the gate electrode 11g is formed in the opening 13g. The insulating film 14 is formed so as to cover the gate electrode 11g over the insulating film 12. While materials used for the insulating films 12 and 14 are not specifically limited, a Si nitride film may be used, for example. The insulating films 12 and 14 are an example of the termination film.

The In-containing layer 36 includes an In-eliminated region 36a. The In-eliminated region 36a is located in the surficial portion of the In-containing layer 36, excluding a region overlapped with the gate electrode 11g in planar view. An In fraction in the region of the In-containing layer 36 excluding the In-eliminated region 36a is substantially constant as described later, whereas the In fraction (In composition) in the In-eliminated region 36a decreases towards the surface (towards shallower portion of the In-eliminated region 36a), similarly to the In-eliminated region 6a in the first embodiment.

Here, compositions of InAlN composing the In-containing layer 36 and the In-eliminated region 36a will be explained. The composition of the In-containing layer 36 in the embodiment may be determined so as to suppress generation of 2DEG in the surficial portion of the electron channel layer 33 in a region in planar view where the In-eliminated region 36a does not exist, or in a region below the gate electrode 11g, based on relation between the lattice constants of GaN of the electron channel layer 33 and InAlN of the In-containing layer 36 (In fraction: 0.30, for example).

Accordingly, the 2DEG hardly exists below the gate electrode 11g, and this allows the normally-off operation in the embodiment. On the other hand, 2DEG having a sufficient level of concentration exists in a region located in planar view below the In-eliminated region 36a, or in an access areas, since the In fraction of the In-eliminated region 36a is not high enough to suppress the 2DEG from generating. In other words, the In-eliminated region 36a functions as the electron supply layer in the embodiment. The on-resistance may therefore be suppressed to a low level. In addition, the In-eliminated region 36a may be formed by annealing, for example, needing no dry etching as detailed later. The current collapse, which may otherwise be induced by damages in the process of dry etching, is avoidable. In addition, operational instability due to electron injection may be suppressed, by suppressing the electron injection similarly to the first embodiment.

In addition, the number of nitride semiconductor layers in the fifth embodiment is smaller than that in the first embodiment. In other words, there is a fewer number of interfaces between different materials. The larger the number of interfaces is, the larger the number of trap levels is, which destabilizes the operation. According to the fifth embodiment, more stable operation may be ensured as compared with the first embodiment. The fifth embodiment is also advantageous in that the number of times the growth conditions are largely varied under minute control, which is performed at every interface between different materials, may be reduced.

As described above, excellent characteristics can be obtained by the embodiment.

Next, a method of manufacturing the GaN-based HEMT (compound semiconductor device) according to the fifth embodiment will be explained. FIG. 8A to FIG. 8L are cross sectional views illustrating, in sequence, a method of manufacturing the GaN-based HEMT (compound semiconductor device) according to the fifth embodiment.

Figure 8A:
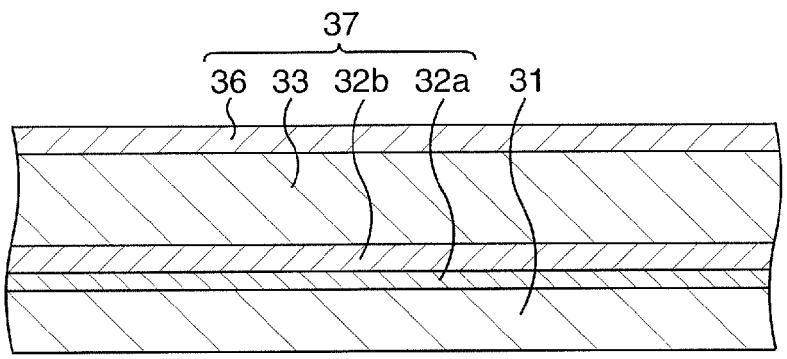

First, as illustrated in FIG. 8A, the compound semiconductor stacked structure 37 is formed over the substrate 31. In the process of forming the compound semiconductor stacked structure 37, the initial layer 32a, the buffer layer 32b, the electron channel layer 33, and the In-containing layer 36 may be formed by a crystal growth process such as MOVPE or MBE. The growth conditions may be similar to those for the initial layer 2a, the buffer layer 2b, the electron channel layer 3 and the In-containing layer 6 in the first embodiment, except for the composition of the mixed gas used for forming the In-containing layer 36.

Figure 8B:
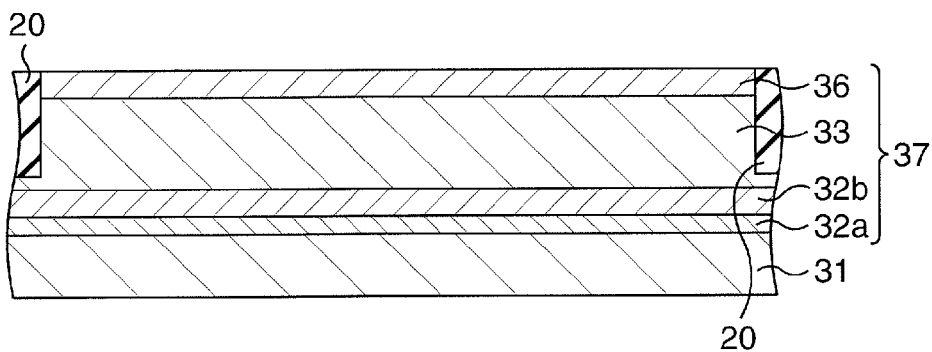
Figure 8C:
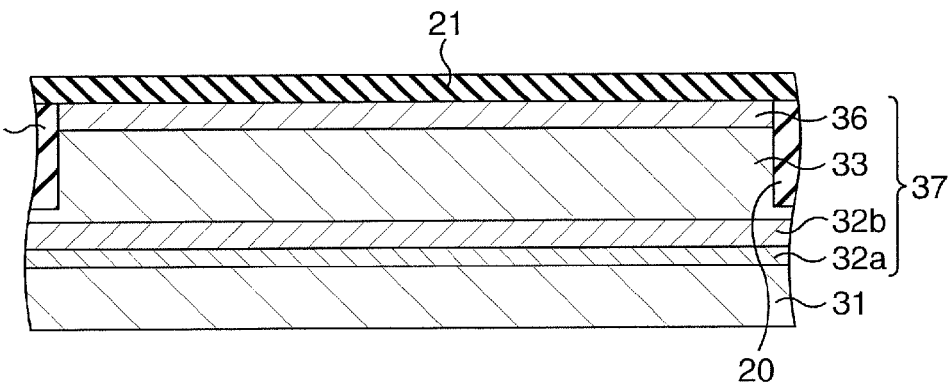
Figure 8D:
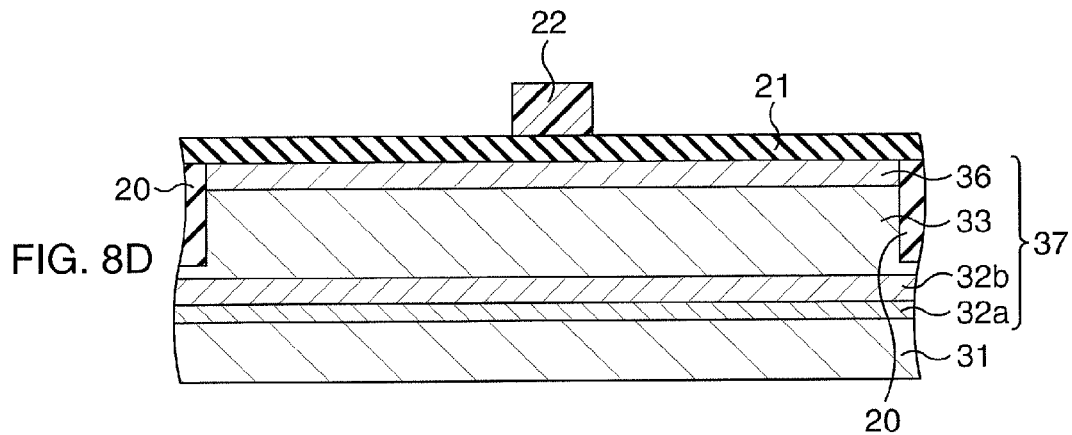
Figure 8E:
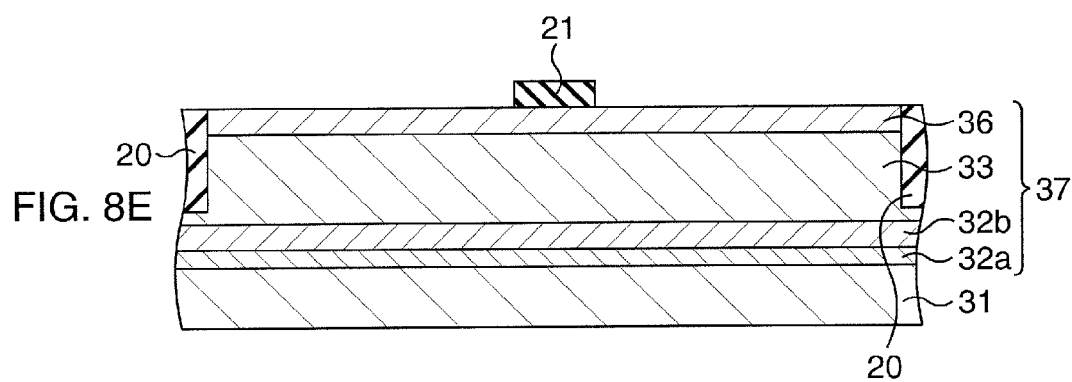

Next, as illustrated in FIG. 8B to FIG. 8D, an element region is defined in the compound semiconductor stacked structure 37, the silicon nitride film 21 is formed over the entire surface, and the resist pattern 22 is formed so as to cover a region in which the gate electrode is to be formed, and so as to expose the residual region. Thereafter, as illustrated in FIG. 8E, similarly to the first embodiment, the silicon nitride film 21 is etched by wet etching using a HF-based solution, through the resist pattern 22 used as an etching mask. As a result, the surface of the In-containing layer 36 exposes in the portions thereof which correspond to the access areas of the GaN-based HEMT. The resist pattern 22 is then removed.

Figure 8F:
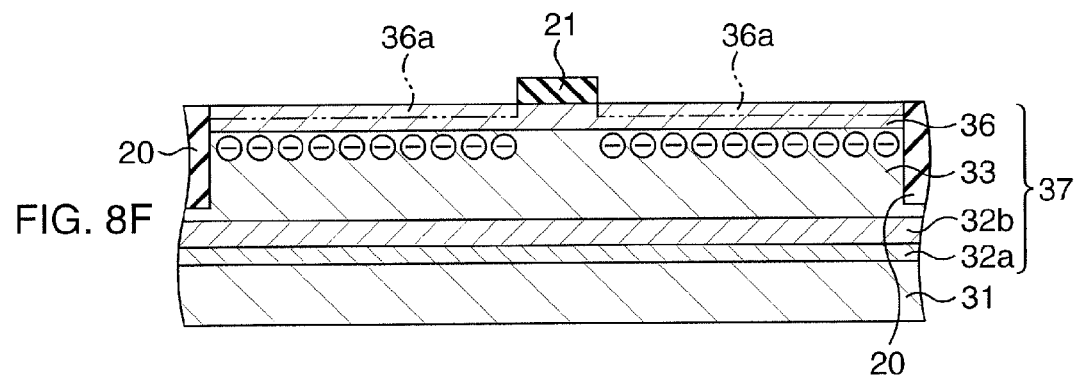

Next, similarly to the first embodiment, annealing is conducted in a non-oxidative atmosphere, to thereby allow indium (In) to be eliminated from the surficial portion of the In-containing layer 36. As a result, as illustrated in FIG. 8F, the In-eliminated region 36a having a lowered indium fraction is formed in the surficial portion of the In-containing layer 36. As the In-eliminated region 36a is formed, a high-concentration 2DEG emerges in the surficial portion of the electron channel layer 33 below the In-eliminated region 36a.

Thereafter, as illustrated in FIG. 8G to FIG. 8I, similarly to the first embodiment, the source electrode 11s and the drain electrode 1id are formed, annealing is conducted so as to establish the ohmic characteristic, the silicon nitride film 21 is removed by wet etching, and the insulating film 12 is formed.

Next, as illustrated in FIG. 8J to FIG. 8L, similarly to the first embodiment, the opening 13g is formed, the gate electrode 11g is formed, and the insulating film 14 is then formed.

The compound semiconductor device according to the fifth embodiment may be thus manufactured.

Sixth Embodiment

Figure 9:
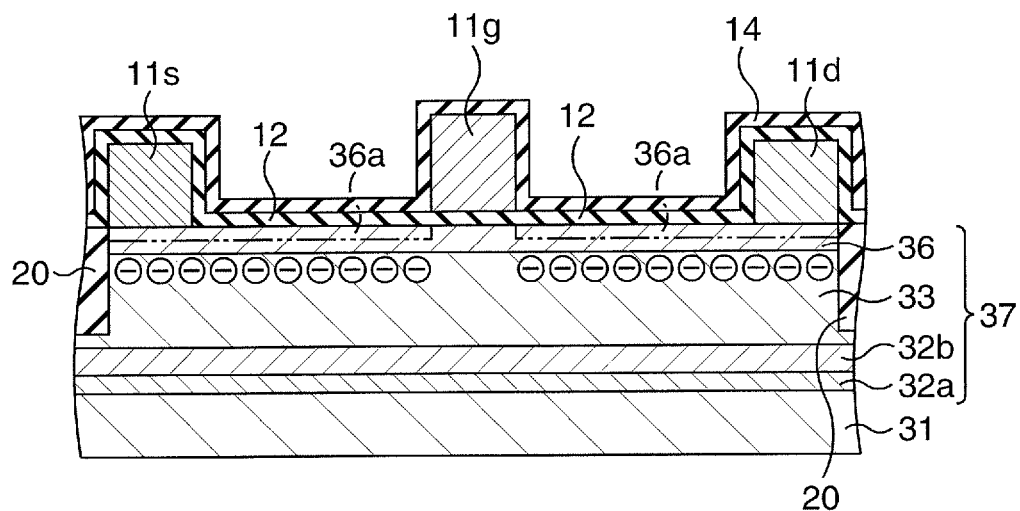
FIG. 9 is a cross sectional view illustrating a structure of a compound semiconductor device according to a sixth embodiment.

Next, a sixth embodiment will be explained. FIG. 9 is a cross sectional view illustrating a structure of a GaN-based HEMT (compound semiconductor device) according to the sixth embodiment.

In contrast to the fifth embodiment, having the gate electrode 11g brought into Schottky contact with the compound semiconductor stacked structure 37, the sixth embodiment adopts the insulating film 12 between the gate electrode 11g and the compound semiconductor stacked structure 37, similarly to the second embodiment, so as to allow the insulating film 12 to function as a gate insulating film. In short, the opening 13g is not formed in the insulating film 12, and a MIS-type structure is adopted.

Also the sixth embodiment thus configured successfully achieves, similarly to the fifth embodiment, the effects of suppressing the current collapse, while achieving the normally-off operation, with the presence of the In-eliminated region 36a.

A material for the insulating film 12 is not specifically limited, similarly to the second embodiment, wherein the preferable examples include oxide, nitride or oxynitride of Si, Al, Hf, Zr, Ti, Ta and W. Aluminum oxide is particularly preferable. Thickness of the insulating film 12 may be 2 nm to 200 nm, and 10 nm or around, for example.

Seventh Embodiment

Figure 10:
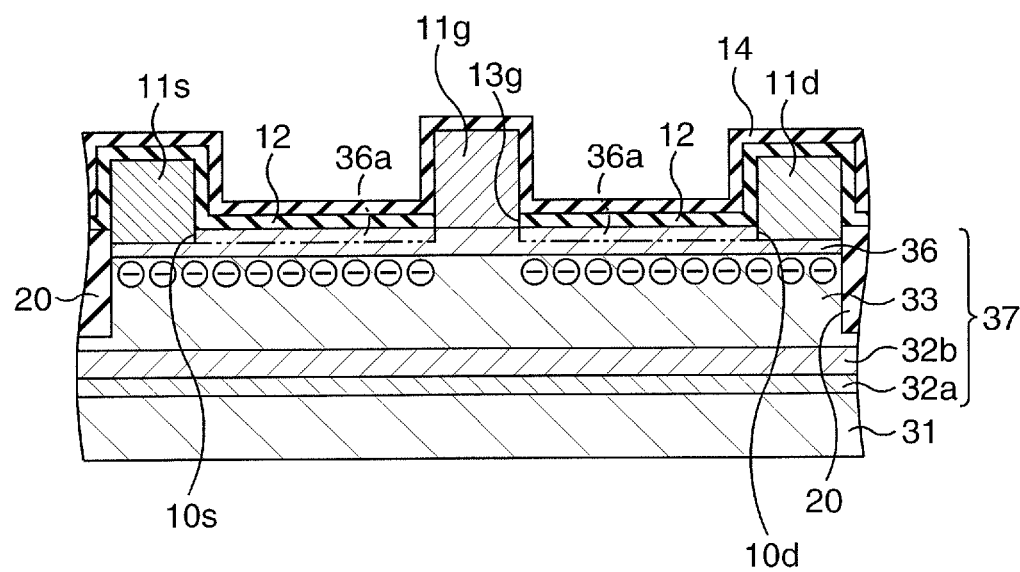
FIG. 10 is a cross sectional view illustrating a structure of a compound semiconductor device according to a seventh embodiment.

Next, a seventh embodiment will be explained. FIG. 10 is a cross sectional view illustrating a structure of a GaN-based HEMT (compound semiconductor device) according to the seventh embodiment.

In contrast to the fifth embodiment, having the source electrode 11s and the drain electrode 1id formed on the flat In-containing layer 36, the recesses 10s and 10d are formed in the In-containing layer 36, and the source electrode 11s and the drain electrode 11d are respectively formed in the recesses 10s and 10d in the third embodiment, similarly to the third embodiment.

Also the seventh embodiment thus configured successfully achieves, similarly to the sixth embodiment, the effect of suppressing the current collapse, while achieving the normally-off operation, with the presence of the In-eliminated region 36a.

The compound semiconductor device according to the seventh embodiment may be manufactured through the steps below, similarly to the third embodiment. The recesses 10s and 10d are formed after the In-eliminated region 36a was formed (FIG. 8F), and before the source electrode 11s and the drain electrode 11d are formed (FIG. 8G). Then the source electrode 11s and the drain electrode 11d are respectively formed in the recesses 10s and 10d. Alternatively, a structure similar to the seventh embodiment may be obtained also by a method of an eighth embodiment described in the next.

Eighth Embodiment

Next, an eighth embodiment will be explained. FIG. 11A to FIG. 11E are cross sectional views illustrating, in sequence, a method of manufacturing a GaN-based HEMT (compound semiconductor device) according to the eighth embodiment.

Figure 11A:
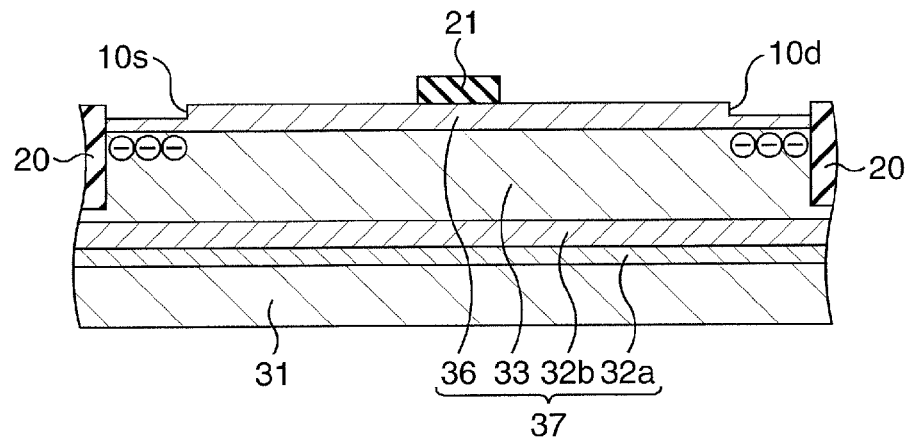
FIGS. 11A to 11E are cross sectional views illustrating, in sequence, a method of manufacturing a compound semiconductor device according to an eighth embodiment.
Figure 11B:
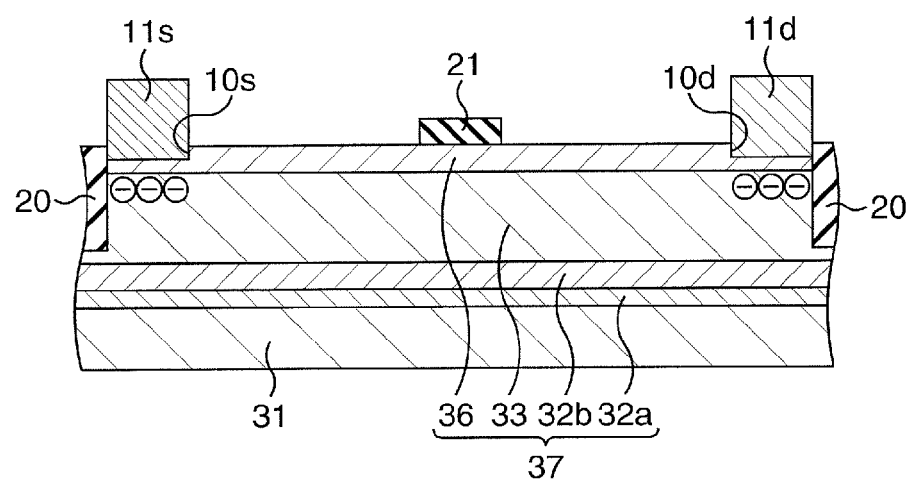

In the embodiment, first, the processes up to the wet etching (patterning) of the silicon nitride film 21 and the removal of the resist pattern 22 are conducted similarly to the fifth embodiment (FIG. 8E). Next, as illustrated in FIG. 11A, the recesses 10s and 10d are formed in the In-containing layer 36. Thereafter, as illustrated in FIG. 11B, the source electrode 11s and the drain electrode 1ld are formed respectively in the recesses 10s and 10d.

Figure 11C:
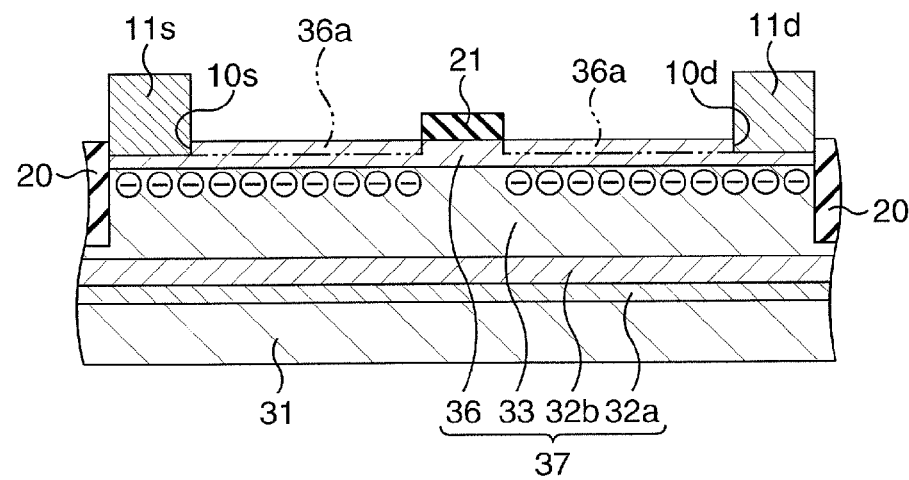

Next, for example, annealing (RTA, for example) is conducted in a $N_2$ gas atmosphere at 400° C. to 1000° C. (at 600° C., for example) to thereby establish the ohmic characteristic, and to allow indium (In) to be eliminated from the surficial portion of the In-containing layer 36. As a result, as illustrated in FIG. 11C, the In-eliminated region 36a having a lowered indium fraction is formed in the surficial portion of the In-containing layer 36. In short, in the embodiment, the annealing for establishing the ohmic characteristic is also effective to form of the In-eliminated region 36a, similarly to the fourth embodiment.

Figure 11D:
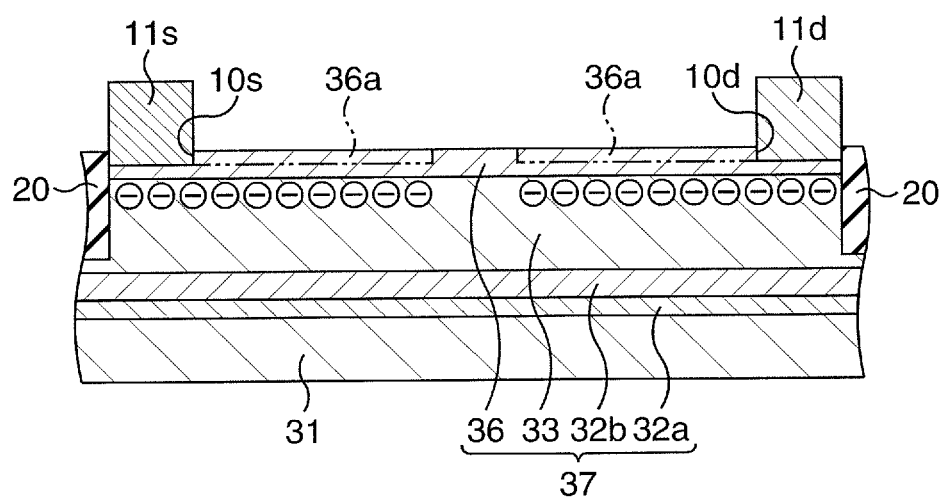
Figure 11E:
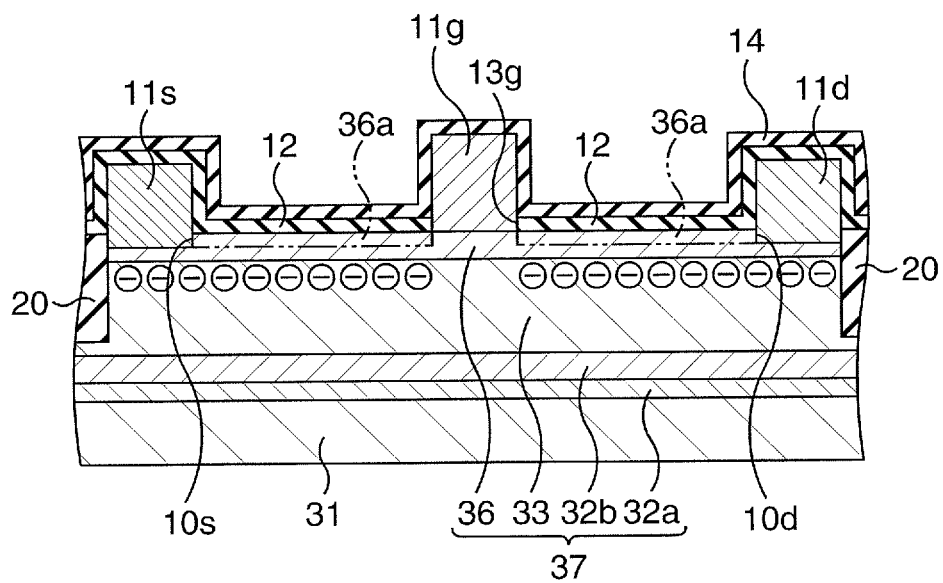

Next, as illustrated in FIG. 11D, the silicon nitride film 21 is removed by wet etching. Thereafter, the processes covering from the formation of the insulating film 12 up to the formation of the insulating film 14 are conducted similarly to the fifth embodiment, as illustrated in FIG. 11E.

According to the eighth embodiment, the number of times of annealing may be reduced from that in the fifth embodiment.

Ninth Embodiment

Figure 12:
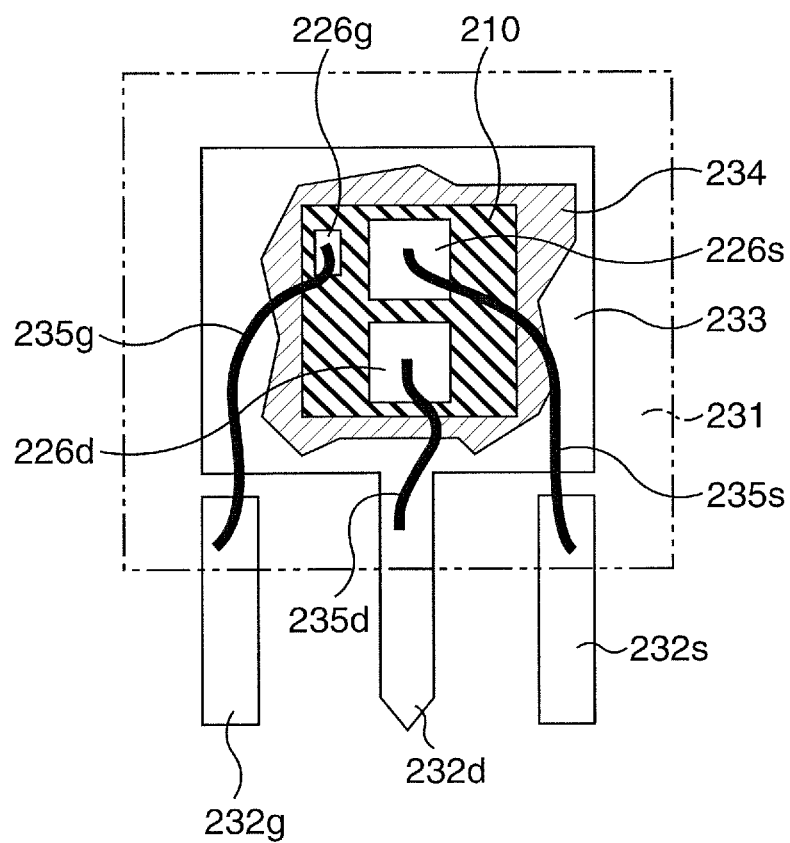
FIG. 12 is a drawing illustrating a discrete package according to a ninth embodiment.

A ninth embodiment relates to a discrete package of a compound semiconductor device which includes the GaN-based HEMT. FIG. 12 is a drawing illustrating the discrete package according to the ninth embodiment.

In the ninth embodiment, as illustrated in FIG. 12, a back surface of a HEMT chip 210 of the compound semiconductor device according to any one of the first to eighth embodiments is fixed on a land (die pad) 233, using a die attaching agent 234 such as solder. One end of a wire 235d such as an Al wire is bonded to a drain pad 226d, to which the drain electrode lid is connected, and the other end of the wire 235d is bonded to a drain lead 232d integral with the land 233. One end of a wire 235s such as an Al wire is bonded to a source pad 226s, to which the source electrode 11s is connected, and the other end of the wire 235s is bonded to a source lead 232s separated from the land 233. One end of a wire 235g such as an Al wire is bonded to a gate pad 226g, to which the gate electrode 11g is connected, and the other end of the wire 235g is bonded to a gate lead 232g separated from the land 233. The land 233, the HEMT chip 210 and so forth are packaged with a molding resin 231, so as to project outwards a portion of the gate lead 232g, a portion of the drain lead 232d, and a portion of the source lead 232s.

The discrete package may be manufactured by the procedures below, for example. First, the HEMT chip 210 is bonded to the land 233 of a lead frame, using a die attaching agent 234 such as solder. Next, with the wires 235g, 235d and 235s, the gate pad 226g is connected to the gate lead 232g of the lead frame, the drain pad 226d is connected to the drain lead 232d of the lead frame, and the source pad 226s is connected to the source lead 232s of the lead frame, respectively, by wire bonding. Then molding the molding resin 231 is conducted by a transfer molding process. The lead frame is then cut away.

Tenth Embodiment

Figure 13:
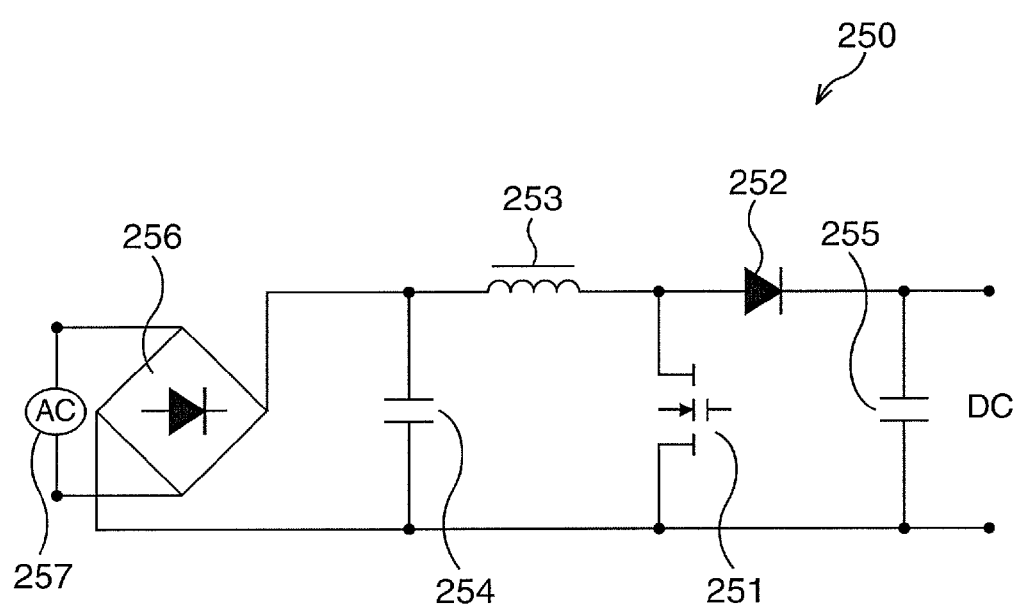
FIG. 13 is a wiring diagram illustrating a power factor correction (PEG) circuit according to a tenth embodiment.

Next, a tenth embodiment will be explained. The tenth embodiment relates to a PFC (power factor correction) circuit equipped with a compound semiconductor device which includes a GaN-based HEMT. FIG. 13 is a wiring diagram illustrating the PFC circuit according to the tenth embodiment.

The PFC circuit 250 includes a switching element (transistor) 251, a diode 252, a choke coil 253, capacitors 254 and 255, a diode bridge 256, and an AC power source (AC) 257. The drain electrode of the switching element 251, the anode terminal of the diode 252, and one terminal of the choke coil 253 are connected with each other. The source electrode of the switching element 251, one terminal of the capacitor 254, and one terminal of the capacitor 255 are connected with each other. The other terminal of the capacitor 254 and the other terminal of the choke coil 253 are connected with each other. The other terminal of the capacitor 255 and the cathode terminal of the diode 252 are connected with each other. A gate driver is connected to the gate electrode of the switching element 251. The AC 257 is connected between both terminals of the capacitor 254 via the diode bridge 256. A DC power source (DC) is connected between both terminals of the capacitor 255. In the embodiment, the compound semiconductor device according to any one of the first to eighth embodiments is used as the switching element 251.

In the process of manufacturing the PFC circuit 250, for example, the switching element 251 is connected to the diode 252, the choke coil 253 and so forth with solder, for example.

Eleventh Embodiment

Figure 14:
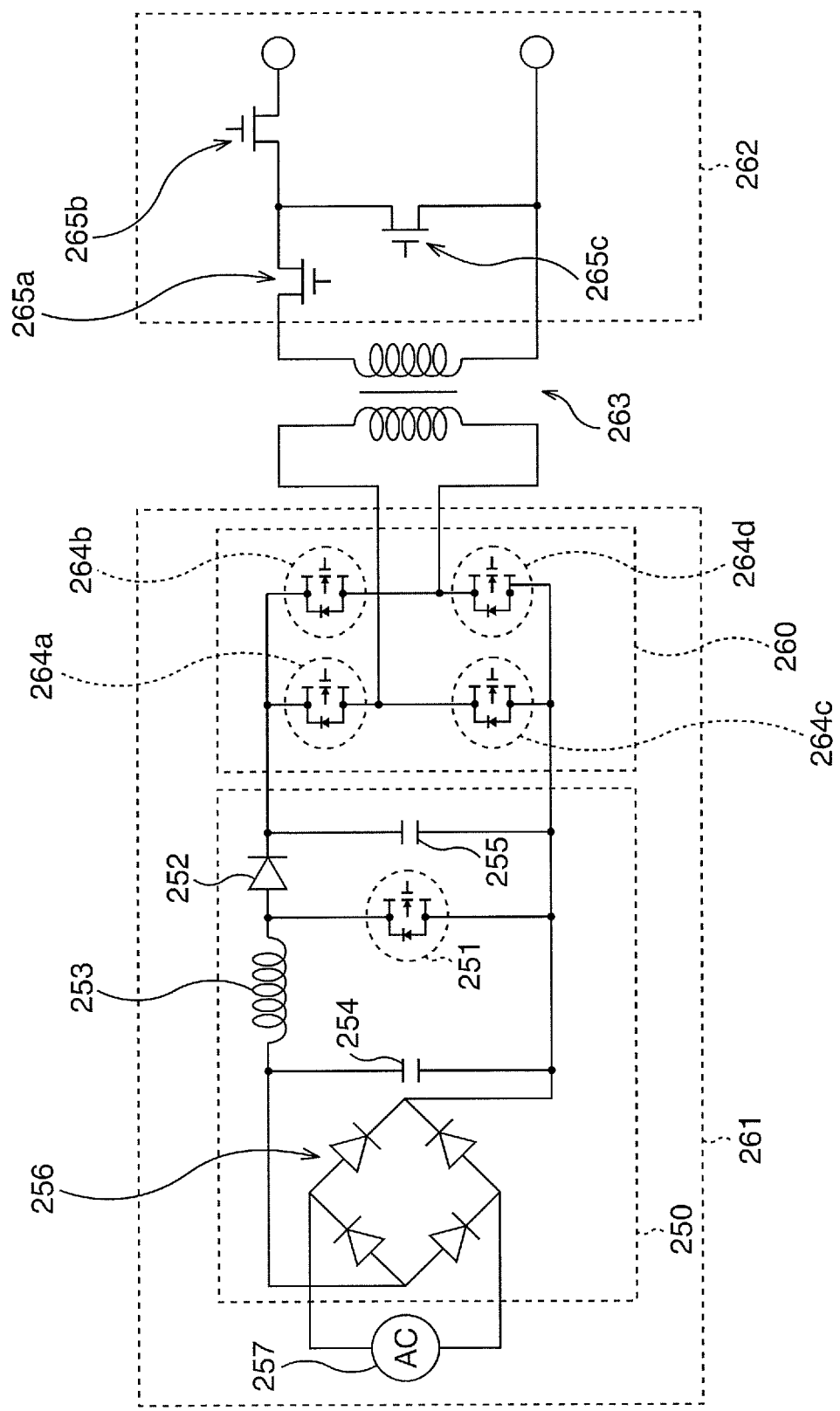
FIG. 14 is a wiring diagram illustrating a power supply apparatus according to an eleventh embodiment.

Next, an eleventh embodiment will be explained. The eleventh embodiment relates to a power supply apparatus equipped with a compound semiconductor device which includes a GaN-based HEMT. FIG. 14 is a wiring diagram illustrating the power supply apparatus according to the eleventh embodiment.

The power supply apparatus includes a high-voltage, primary-side circuit 261, a low-voltage, secondary-side circuit 262, and a transformer 263 arranged between the primary-side circuit 261 and the secondary-side circuit 262.

The primary-side circuit 261 includes the PFC circuit 250 according to the tenth embodiment, and an inverter circuit, which may be a full-bridge inverter circuit 260, for example, connected between both terminals of the capacitor 255 in the PFC circuit 250. The full-bridge inverter circuit 260 includes a plurality of (four, in the embodiment) switching elements 264a, 264b, 264c and 264d.

The secondary-side circuit 262 includes a plurality of (three, in the embodiment) switching elements 265a, 265b and 265c.

In the embodiment, the compound semiconductor device according to any one of the first to eighth embodiments is used for the switching element 251 of the PFC circuit 250, and for the switching elements 264a, 264b, 264c and 264d of the full-bridge inverter circuit 260. The PFC circuit 250 and the full-bridge inverter circuit 260 are components of the primary-side circuit 261. On the other hand, a silicon-based general MIS-FET (field effect transistor) is used for the switching elements 265a, 265b and 265c of the secondary-side circuit 262.

Twelfth Embodiment

Figure 15:
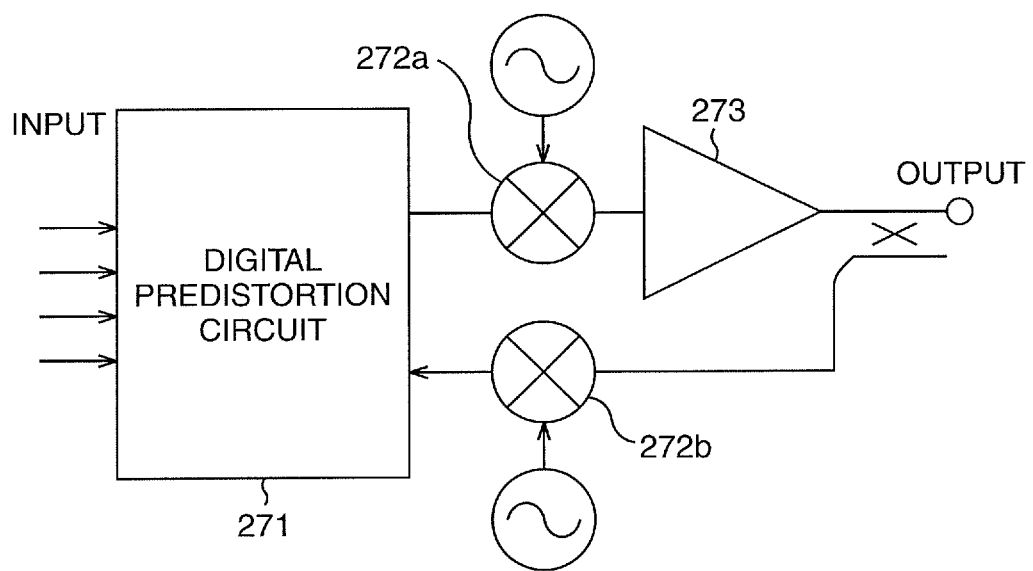
FIG. 15 is a wiring diagram illustrating a high-frequency amplifier according to a twelfth embodiment.

Next, a twelfth embodiment will be explained. The twelfth embodiment relates to a high-frequency amplifier equipped with a compound semiconductor device which includes a GaN-based HEMT. FIG. 15 is a wiring diagram illustrating the high-frequency amplifier of the twelfth embodiment.

The high-frequency amplifier includes a digital predistortion circuit 271, mixers 272a and 272b, and a power amplifier 273.

The digital predistortion circuit 271 compensates non-linear distortion in input signals. The mixer 272a mixes the input signal having the non-linear distortion already compensated, with an AC signal. The power amplifier 273 includes the compound semiconductor device according to any one of the first to eighth embodiments, and amplifies the input signal mixed with the AC signal. In the illustrated example of the embodiment, the signal on the output side may be mixed, upon switching, with an AC signal by the mixer 272b, and may be sent back to the digital predistortion circuit 271.

Composition of the compound semiconductor layers used for the compound semiconductor stacked structure is not specifically limited, and GaN, AlN, InN and so forth may be used. Also mixed crystals of them may be used. In particular, the material for composing the nitride semiconductor layer which contains the In-containing layer is not limited to InAlN, and may be $In_xAl_yGa_{1-x-y}N$ ($0<x\leq1, 0\leq y<1, x+y\leq1$) or the like.

Configurations of the gate electrode, the source electrode and the drain electrode are not limited to those in the above-described embodiments. For example, they may be configured by a single layer. The method of forming these electrodes is not limited to the lift-off process. The annealing after the formation of the source electrode and the drain electrode may be omissible, so long as the ohmic characteristic is obtainable. The gate electrode may be annealed.

The substrate may be a silicon carbide (SiC) substrate, a sapphire substrate, a silicon substrate, a GaN substrate, GaAs substrate or the like. The substrate may be any of electro-conductive, semi-insulating, and insulating ones. In consideration of cost, it is preferable to use a Si substrate (for example, a Si substrate having the (111) plane), SiC substrate or sapphire substrate. Also the thickness and materials for composing the individual layers are not limited to those described in the embodiments.

Next, experiments conducted by the present inventors will be explained.

(First Experiment)

Figure 16:
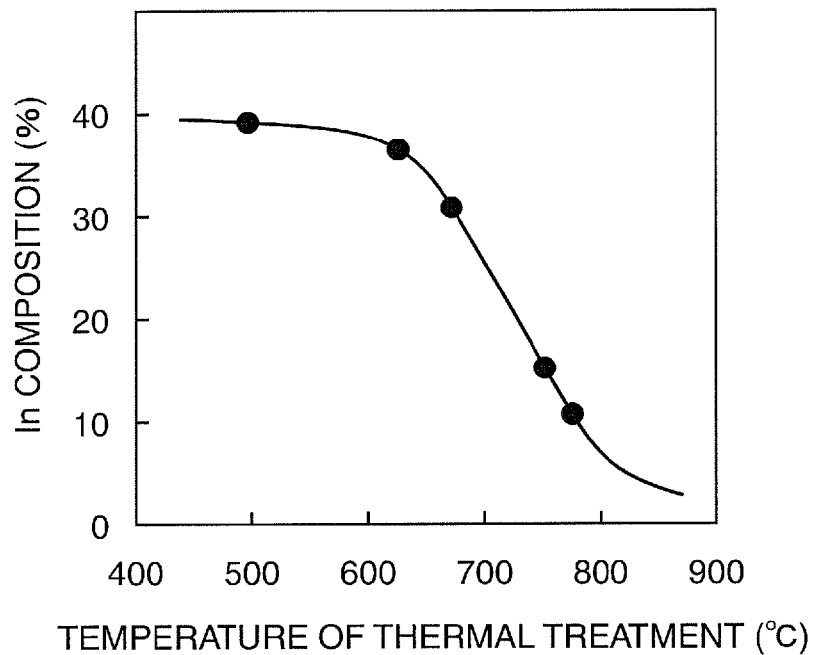
FIG. 16 is a drawing illustrating a result of a first experiment.

In a first experiment, an $In_{0.4}Al_{0.6}N$ layer was formed, then annealed at various temperatures, and the In fraction after the annealing was measured. The annealing was conducted in a $N_2$ atmosphere for 10 minutes. The result is illustrated in FIG. 16.

Figure 17:
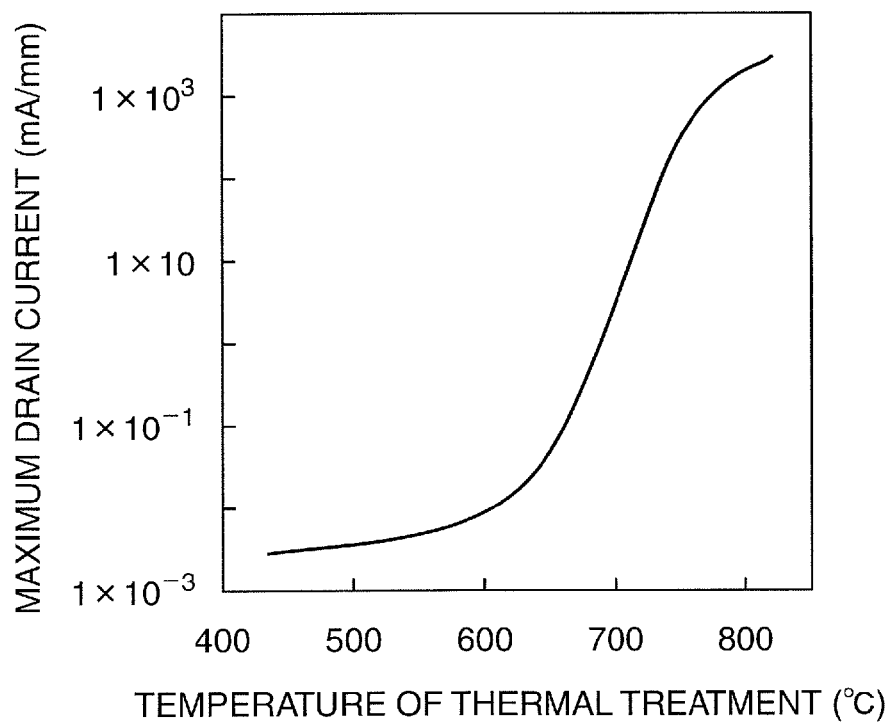
FIG. 17 is a drawing illustrating a result of a second experiment.

The In fraction strongly depended on the annealing temperature, and most effective elimination of In occurred at 700° C. to 800° C., as illustrated in FIG. 17.

(Second Experiment)

In a second experiment, the compound semiconductor devices were manufactured similarly to the fifth embodiment, while varying the annealing temperature, and a relation between the annealing temperature and maximum drain current was obtained. The result is illustrated in FIG. 17.

As the annealing temperature elevated, the access resistance decreased, and the maximum drain current increased, as illustrated in FIG. 17. This is due to phenomena that the higher the annealing temperature is, the more prominent the elimination of In is and the lower the In fraction is, and that the lower the In fraction is, the stronger the spontaneous polarization and piezo polarization are and the more notably the 2DEG is induced.

(Third Experiment)

Figure 18A:
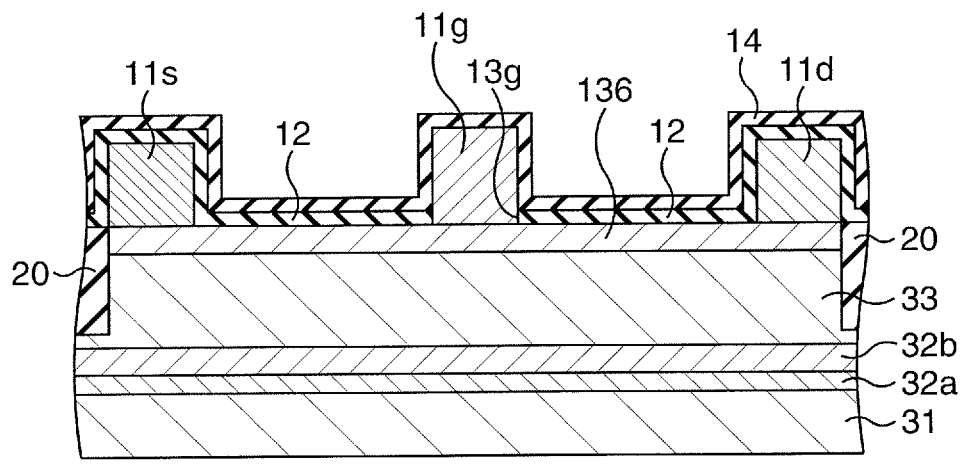
FIGS. 18A and 18B are cross sectional views illustrating a compound semiconductor device of a referential example.
Figure 19A:
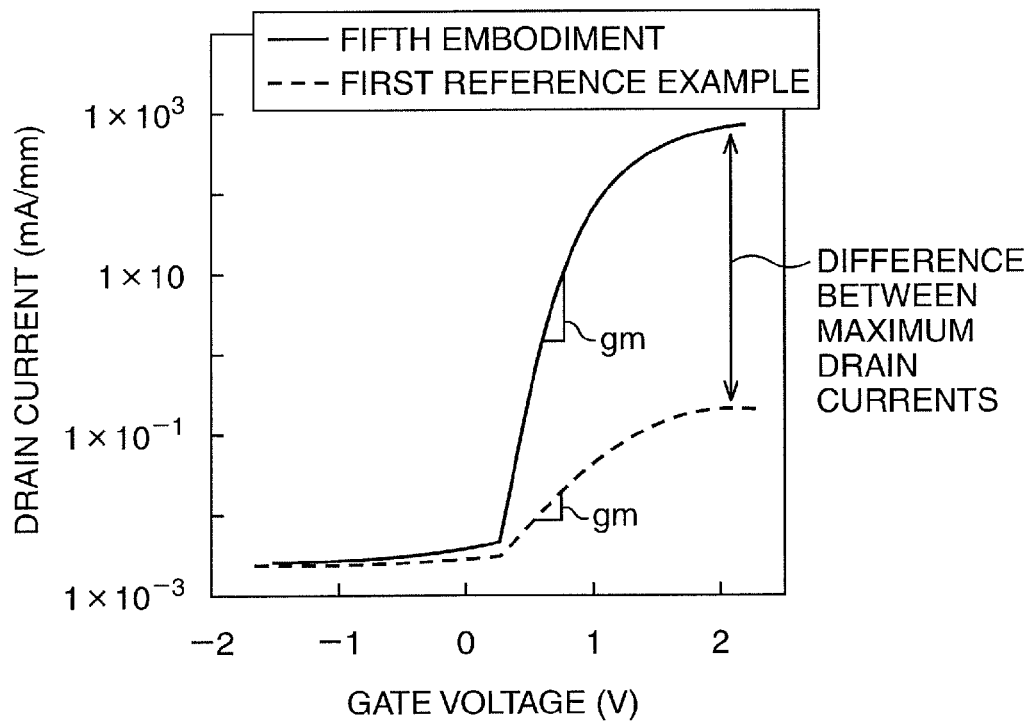
FIGS. 19A and 19B are drawings illustrating a result of a third experiment and a fourth experiment.

In a third experiment, relations between the gate voltage and the drain current were obtained with respect to the fifth embodiment and a first referential example illustrated in FIG. 18A. The result is illustrated in FIG. 19A. Note that the first referential example included an In-containing layer 136 which did not include the In-eliminated region 36a, in place of the In-containing layer 36 of the fifth embodiment.

The fifth embodiment was low in the access resistance and high in the maximum drain current, with the presence of the In-eliminated region 36a, as illustrated in FIG. 19A. Moreover, controllability of the gate electrode (mutual conductance gm) increased, as the access resistance decreased. It is therefore clear that the fifth embodiment successfully yielded effects of improving the gate controllability and increasing the maximum drain current.

(Fourth Experiment)

Figure 18B:
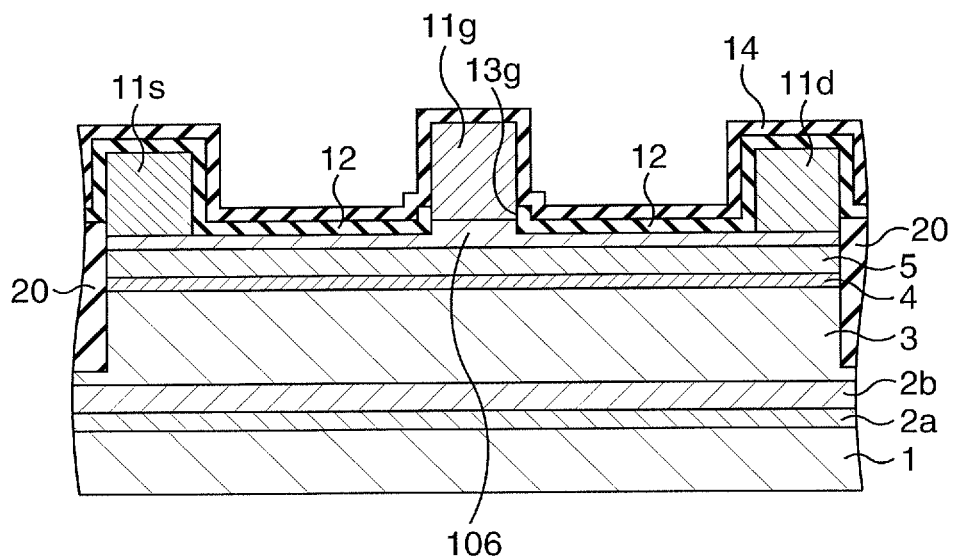
Figure 19B:
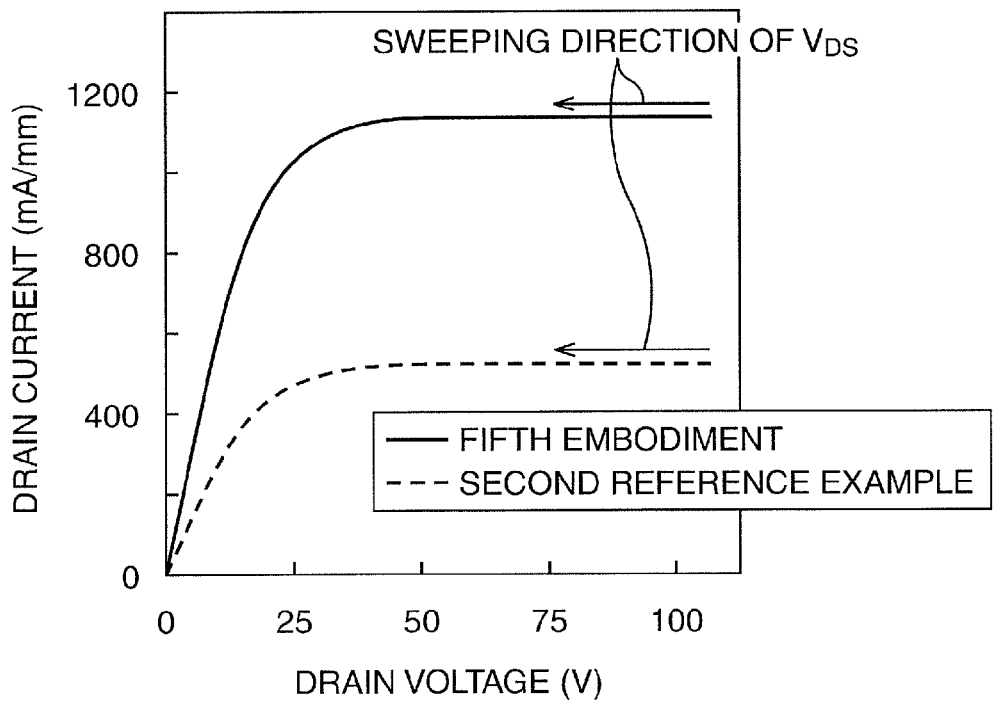

In a fourth experiment, relations between the drain voltage $V_{DS}$ and drain current were obtained with respect to the fifth embodiment and a second referential example illustrated in FIG. 18B, after stressing by applying a high bias to the drain electrode 11d. In other words, this experiment related to an investigation into the degree of current collapse. The result is illustrated in FIG. 19B. Note that the second referential example included an In-containing layer 106 which did not include the In-eliminated region 6a, and to which dry etching had been performed for generating 2DEG, in place of using the In-containing layer 6 of the first embodiment.

The fifth embodiment was decreased in the current collapse to a large degree, as compared with the second referential example, as illustrated in FIG. 19B. This is mainly ascribable to three following factors.

Firstly, in the second referential example, the access areas had a lot of damages remained therein, as a result of dry etching conducted to remove the In-containing layer 106. Accordingly, there were a lot of trap levels causative of the current collapse, and thereby the drain current considerably decreased under a large bias load applied to the drain electrode. In contrast, the fifth embodiment had no etching damage causative of inducing the trap level, since the In-containing layer 36 was not removed by dry etching. This is why the current collapse was suppressed.

Secondly, the second referential example had an interface between InAlN and AlGaN. In the process of growth of these nitride semiconductor layers, a lot of trap levels were likely to occur, since the growth conditions were largely varied at the interface. In contrast, the fifth embodiment had no interface between InAlN and AlGaN, so that there was a fewer number of trap levels causative of the current collapse, and thereby the current collapse was successfully suppressed.

Thirdly, the In fraction in the surficial portion of the In-containing layer 6 which included the In-eliminated region 6a was lower than that in the In-containing layer 106. The fifth embodiment therefore had a larger band gap of the semiconductor layer which was brought into contact with the gate electrode 11g, and was elevated in the Schottky barrier to the gate electrode 11g. Accordingly, leakage current was less likely to flow from the gate electrode 11g towards the surface, and thereby the electron injection into the surficial portion, possibly causative of the current collapse, might be suppressed. This is the reason why the current collapse was suppressed.

According to the compound semiconductor device and so forth described above, the normally-off operation can be achieved while suppressing the current collapse, with the presence of the nitride semiconductor layer with an appropriately adjusted In fraction, formed above the electron channel layer.

All examples and conditional language provided herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device comprising;
   a substrate;
   a compound semiconductor stacked structure formed over the substrate; and
   a gate electrode, a source electrode and a drain electrode formed on or above the compound semiconductor stacked structure, wherein
   the compound semiconductor stacked structure comprises:
   an electron channel layer; and
   a nitride semiconductor layer which comprises an electron supply layer formed over the electron channel layer, and
   an indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

2. The compound semiconductor device according to claim 1, wherein the nitride semiconductor layer comprises an In-containing layer formed over the electron supply layer.

3. The compound semiconductor device according to claim 2, wherein the In-containing layer comprises an In-eliminated region in which an indium (In) fraction reduces towards a shallower portion thereof in each of a region between the gate electrode and the source electrode and a region between the gate electrode and the drain electrode.

4. The compound semiconductor device according to claim 1, wherein the electron supply layer is an In-containing layer.

5. The compound semiconductor device according to claim 3, wherein the In-containing layer comprises an In-eliminated region in which an indium (In) fraction reduces towards a shallower portion thereof in each of a region between the gate electrode and the source electrode and a region between the gate electrode and the drain electrode.

6. The compound semiconductor device according to claim 1, wherein composition of the nitride semiconductor layer is represented by $In_xAl_yGa_{1-x-y}N$ ($0<x\leq1$, $0\leq y<1$, $x+y\leq1$).

7. The compound semiconductor device according to claim 1, further comprising a gate insulating film formed between the gate electrode and the compound semiconductor stacked structure.

8. The compound semiconductor device according to claim 1, further comprising a termination film which covers the compound semiconductor stacked structure in each of a region between the gate electrode and the source electrode and a region between the gate electrode and the drain electrode.

9. A power supply apparatus comprising
   a compound semiconductor device, which comprises:
   a substrate;
   a compound semiconductor stacked structure formed over the substrate; and
   a gate electrode, a source electrode and a drain electrode formed on or above the compound semiconductor stacked structure, wherein
   the compound semiconductor stacked structure comprises:
   an electron channel layer; and
   a nitride semiconductor layer which comprises an electron supply layer formed over the electron channel layer, and
   an indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

10. An amplifier comprising
    a compound semiconductor device, which comprises:
    a substrate;
    a compound semiconductor stacked structure formed over the substrate; and
    a gate electrode, a source electrode and a drain electrode formed on or above the compound semiconductor stacked structure, wherein
    the compound semiconductor stacked structure comprises:
    an electron channel layer; and
    a nitride semiconductor layer which comprises an electron supply layer formed over the electron channel layer, and
    an indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

11. A method of manufacturing a compound semiconductor device comprising:
    forming a compound semiconductor stacked structure over a substrate; and
    forming a gate electrode, a source electrode and a drain electrode on or above the compound semiconductor stacked structure; wherein
    the forming the compound semiconductor stacked structure further comprises:
    forming an electron channel layer; and
    forming a nitride semiconductor layer which comprises an electron supply layer over the electron channel layer, and
    an indium (In) fraction at a surface of the nitride semiconductor layer in each of a region between the gate electrode and the source electrode and a region between the gate electrode and the drain electrode is lower than an indium (In) fraction at a surface of the nitride semiconductor layer in a region below the gate electrode.

12. The method of manufacturing a compound semiconductor device according to claim 11, wherein the forming the nitride semiconductor layer further comprises:
    forming an In-containing layer over the electron supply layer; and
    eliminating indium (In) from the In-containing layer in each of a region between the gate electrode and the source electrode and a region between the gate electrode and the drain electrode.

13. The method of manufacturing a compound semiconductor device according to claim 11, wherein
    the electron supply layer is an In-containing layer, and
    the forming the nitride semiconductor layer further comprises eliminating indium (In) from the In-containing layer in each of a region between the gate electrode and the source electrode and a region between the gate electrode and the drain electrode.

14. The method of manufacturing a compound semiconductor device according to claim 12, wherein forming the eliminating indium (In) comprises annealing in a non-oxidative atmosphere using a mask which covers a region in which the gate electrode is to be formed.

15. The method of manufacturing a compound semiconductor device according to claim 13, wherein forming the eliminating indium (In) comprises annealing in a non-oxidative atmosphere using a mask which covers a region in which the gate electrode is to be formed.

16. The method of manufacturing a compound semiconductor device according to claim 14, wherein the non-oxidative atmosphere is a $N_2$ gas atmosphere, $H_2$ gas atmosphere, or a mixed gas atmosphere of $N_2$ gas and $H_2$ gas.

17. The method of manufacturing a compound semiconductor device according to claim 15, wherein the non-oxidative atmosphere is a $N_2$ gas atmosphere, $H_2$ gas atmosphere, or a mixed gas atmosphere of $N_2$ gas and $H_2$ gas.

18. The method of manufacturing a compound semiconductor device according to claim 14, wherein ohmic characteristic of the source electrode and the drain electrode is established during the annealing.

19. The method of manufacturing a compound semiconductor device according to claim 11, further comprising forming a gate insulating film on or above the compound semiconductor stacked structure before the forming the gate electrode.

20. The method of manufacturing a compound semiconductor device according to claim 11, further comprising forming a termination film which covers the compound semiconductor stacked structure in each of a region between the gate electrode and the source electrode and a region between the gate electrode and the drain electrode.

* * * * *